(12) United States Patent
Herrmann et al.

(10) Patent No.: US 11,211,533 B2
(45) Date of Patent: Dec. 28, 2021

(54) OPTOELECTRONIC COMPONENT AND DISPLAY DEVICE

(71) Applicant: OSRAM OLED GmbH, Regensburg (DE)

(72) Inventors: Siegfried Herrmann, Neukirchen (DE); Michael Völkl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/765,192

(22) PCT Filed: Nov. 27, 2018

(86) PCT No.: PCT/EP2018/082697
§ 371 (c)(1),
(2) Date: May 19, 2020

(87) PCT Pub. No.: WO2019/110377
PCT Pub. Date: Jun. 13, 2019

(65) Prior Publication Data
US 2020/0295244 A1    Sep. 17, 2020

(30) Foreign Application Priority Data
Dec. 8, 2017   (DE) ................. 10 2017 129 226.8

(51) Int. Cl.
*H01L 33/58* (2010.01)
*H01L 25/075* (2006.01)
(Continued)

(52) U.S. Cl.
CPC .......... *H01L 33/58* (2013.01); *H01L 25/0753* (2013.01); *H01L 33/502* (2013.01); *H01L 33/56* (2013.01); *H01L 33/62* (2013.01)

(58) Field of Classification Search
CPC ... H01L 33/58; H01L 25/0753; H01L 33/502; H01L 33/56; H01L 33/62
See application file for complete search history.

(56) References Cited

U.S. PATENT DOCUMENTS

2002/0005523 A1   1/2002   Taniguchi et al.
2003/0107316 A1   6/2003   Murakami et al.
(Continued)

FOREIGN PATENT DOCUMENTS

DE   10 2011 012 264 A1   8/2012
DE   11 2013 005 849 T5   8/2015
(Continued)

*Primary Examiner* — Eliseo Ramos Feliciano
*Assistant Examiner* — Mikka Liu
(74) *Attorney, Agent, or Firm* — DLA Piper LLP (US)

(57) ABSTRACT

An optoelectronic component, having an optoelectronic semiconductor chip, includes a substrate, wherein at least two light-emitting sections are arranged laterally next to one another over an upper side of the substrate, the light-emitting sections are separately controllable, the light-emitting sections generate electromagnetic radiation from different spectral ranges, the light-emitting sections are formed by a layer sequence, an active region is formed inside the layer sequence, trenches are formed between the light-emitting sections, and the trenches fully divide the active region so that the light-emitting sections are separated from one another.

19 Claims, 12 Drawing Sheets

(51) Int. Cl.
  *H01L 33/50*  (2010.01)
  *H01L 33/56*  (2010.01)
  *H01L 33/62*  (2010.01)

(56) References Cited

U.S. PATENT DOCUMENTS

| | | | |
|---|---|---|---|
| 2008/0272712 A1 | 11/2008 | Jalink et al. | |
| 2012/0161196 A1 | 6/2012 | Lowenthal et al. | |
| 2012/0256200 A1 | 10/2012 | Yao | |
| 2015/0362165 A1* | 12/2015 | Chu | H01L 27/156 362/235 |

FOREIGN PATENT DOCUMENTS

| | | |
|---|---|---|
| DE | 10 2016 223 645 A1 | 6/2017 |
| DE | 10 2016 100 351 A1 | 7/2017 |
| DE | 10 2016 104 385 A1 | 9/2017 |
| DE | 10 2017 105 746 A1 | 10/2017 |

\* cited by examiner

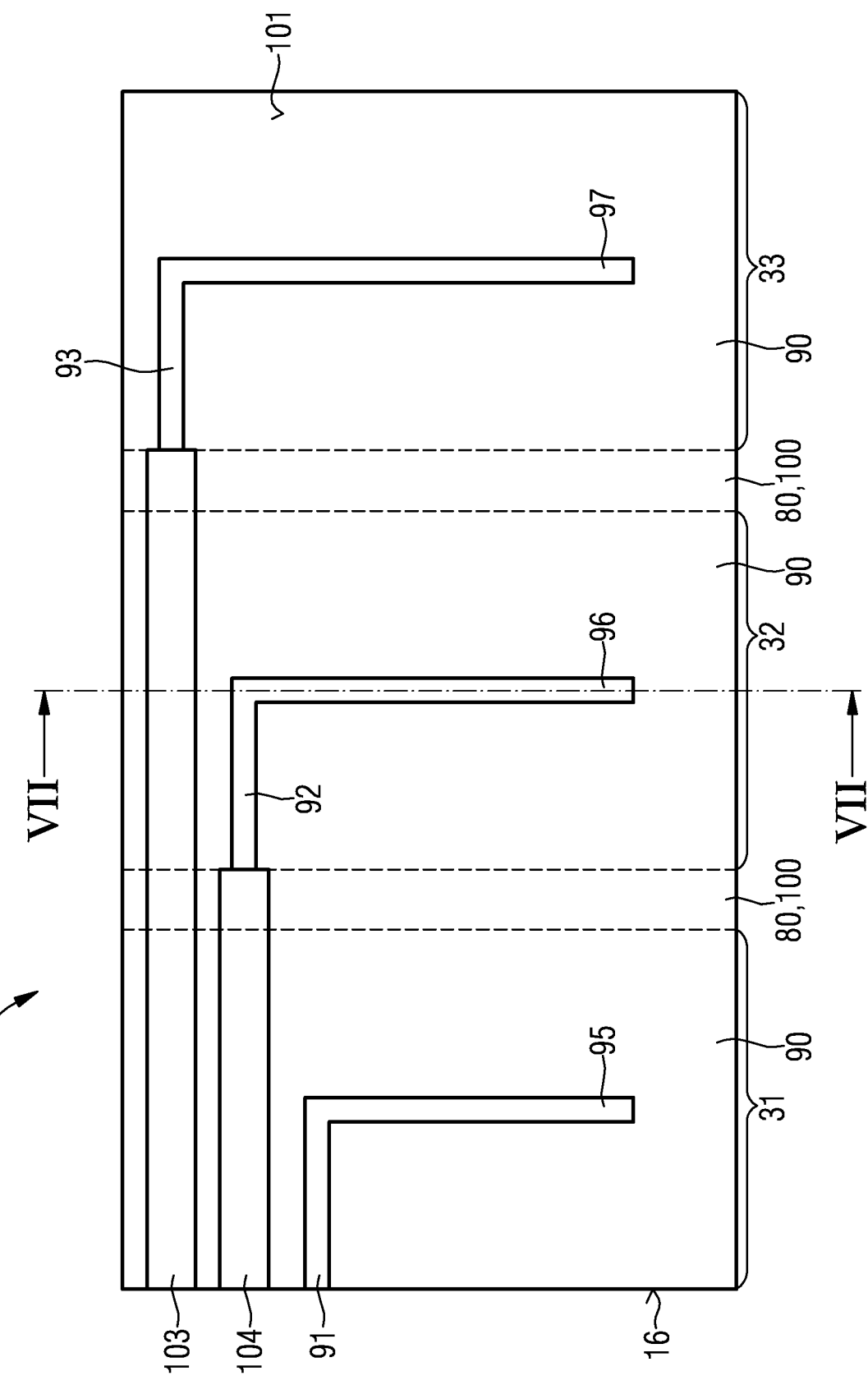

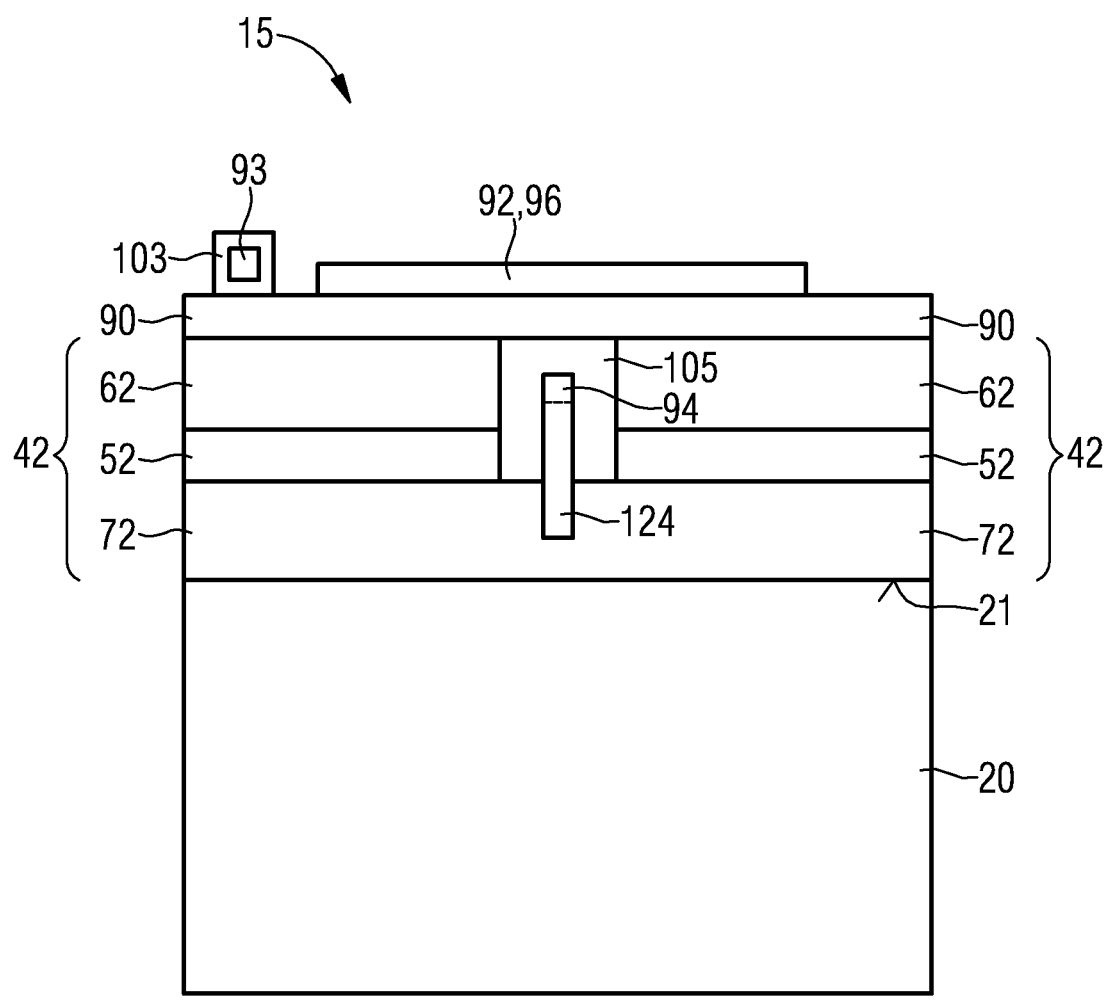

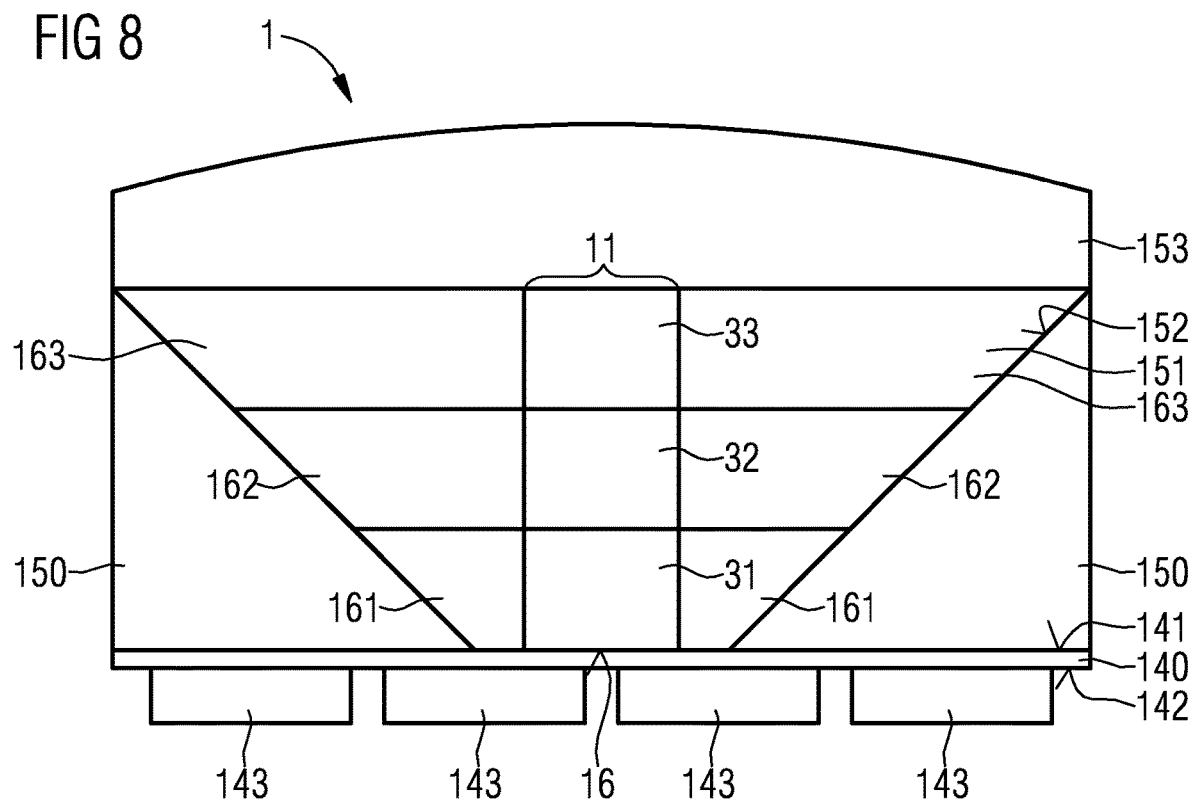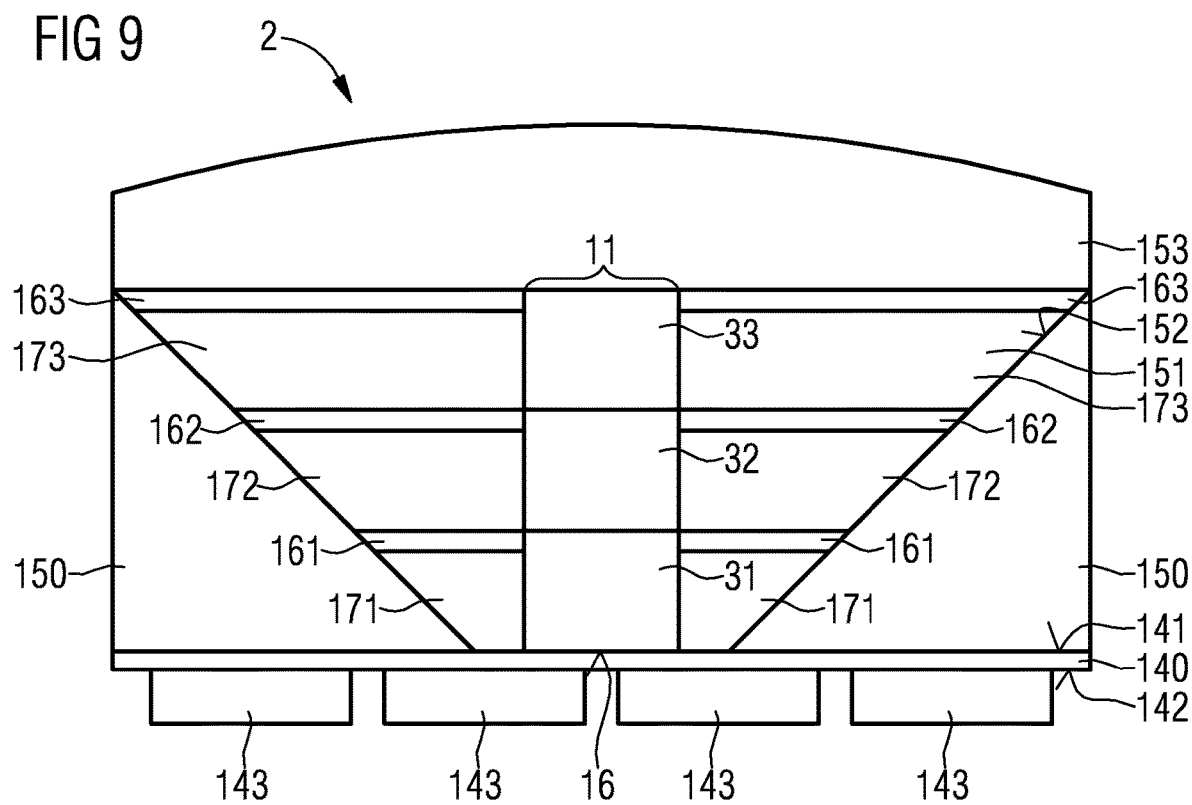

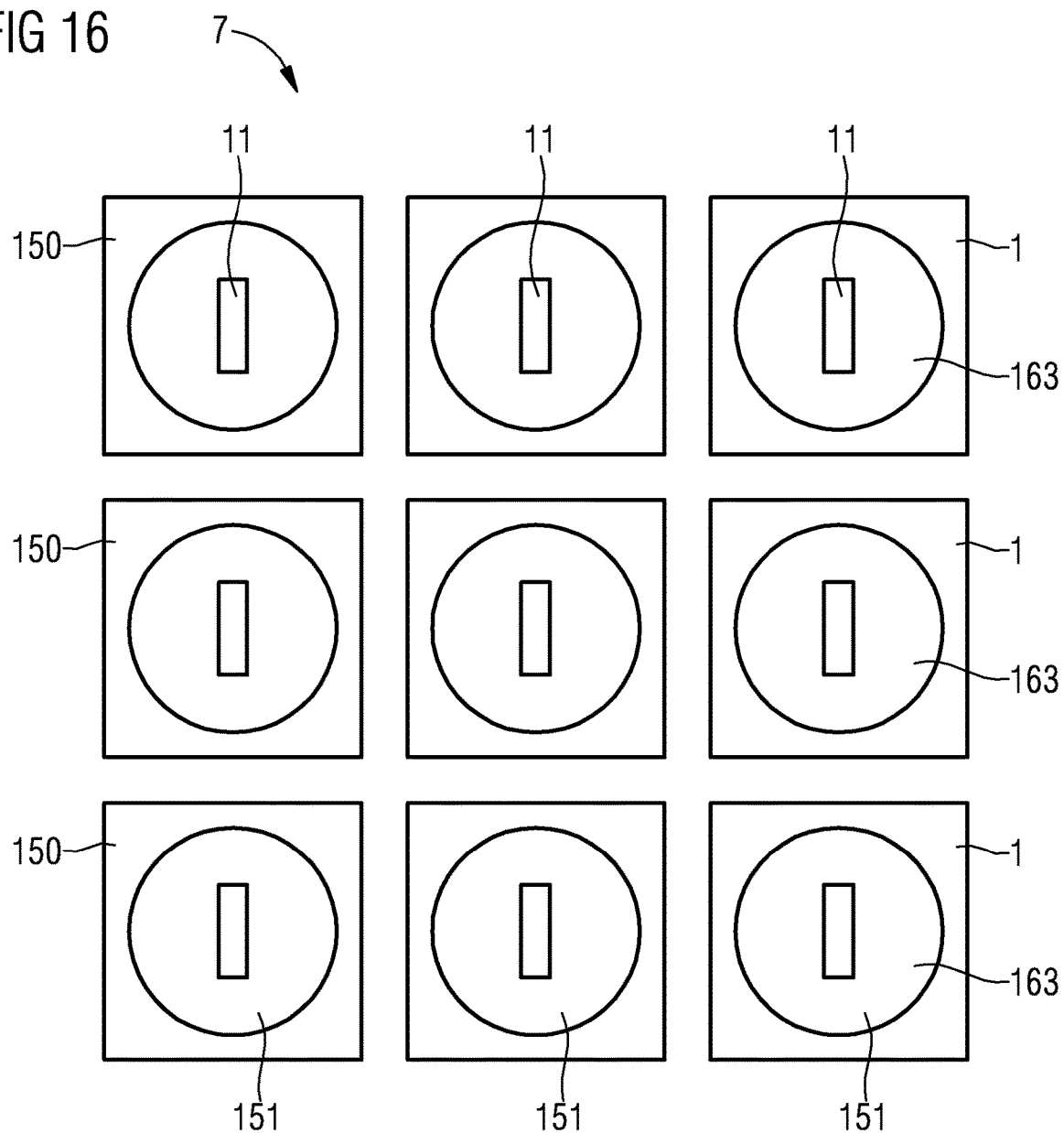

OPTOELECTRONIC COMPONENT AND DISPLAY DEVICE

TECHNICAL FIELD

This disclosure relates to an optoelectronic component and a display device.

BACKGROUND

Light-emitting diodes having a multiplicity of optoelectronic semiconductor chips arranged in a package body are known.

SUMMARY

We provide an optoelectronic component, having an optoelectronic semiconductor chip, comprising a substrate, wherein at least two light-emitting sections are arranged laterally next to one another over an upper of the substrate, and the light-emitting sections are separately controllable.

We also provide a display device having an arrangement consisting of a multiplicity of optoelectronic components, wherein the optoelectronic components are configured as having an optoelectronic semiconductor chip, comprising a substrate, wherein at least two light-emitting sections are arranged laterally next to one another over an upper side of the substrate, and the light-emitting sections are separately controllable.

BRIEF DESCRIPTION OF THE DRAWINGS

FIG. 6 schematically shows a plan view of a fifth example of an optoelectronic semiconductor chip.

FIG. 7 schematically shows a lateral sectional view of the fifth example of the optoelectronic semiconductor chip.

FIG. 8 schematically shows a lateral sectional view of a first example of an optoelectronic component.

FIG. 9 schematically shows a lateral sectional view of a second example of an optoelectronic component.

FIG. 16 schematically shows a plan view of a display device consisting of a multiplicity of optoelectronic components.

Figure 1:
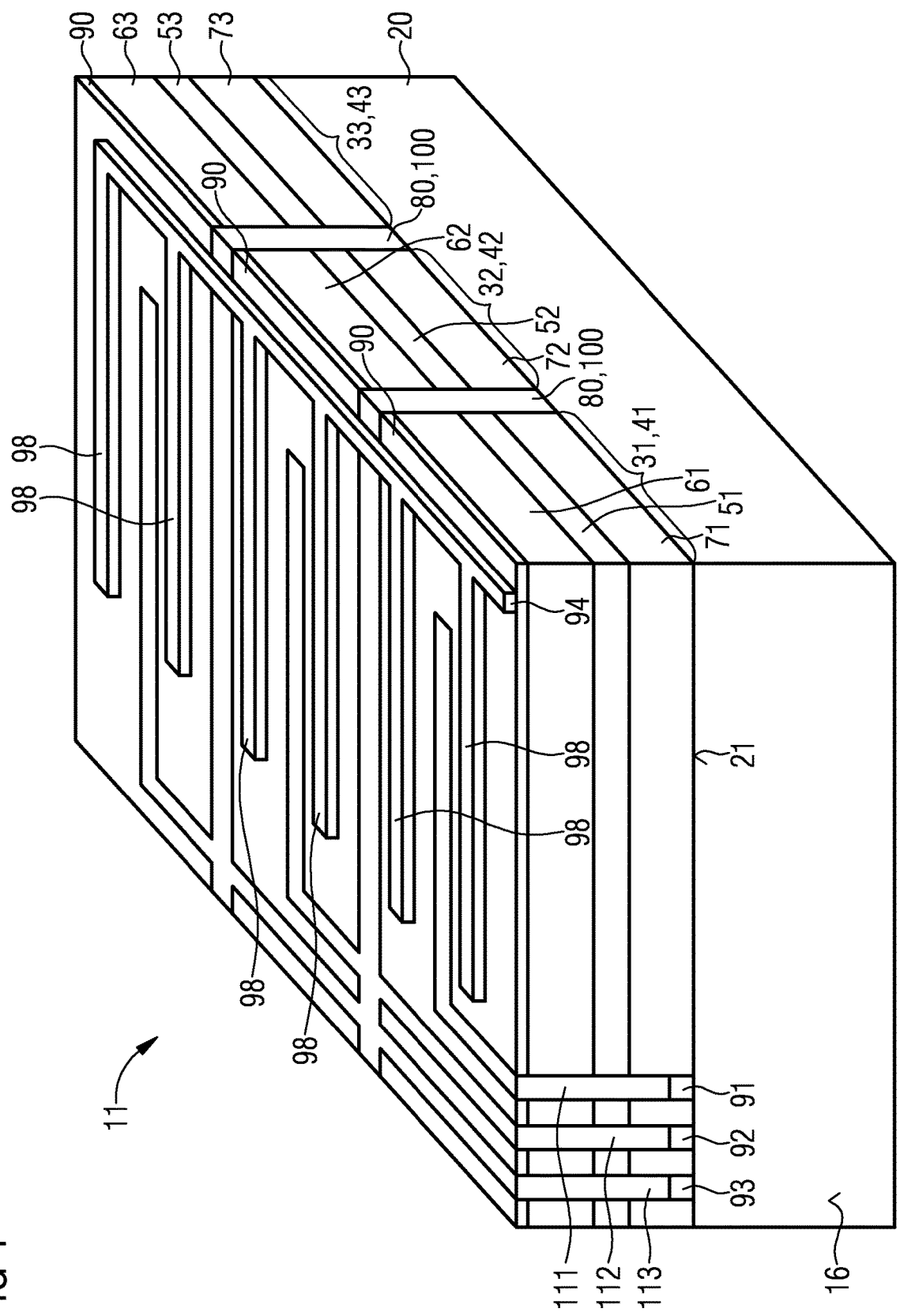
FIG. 1 schematically shows a perspective view of a first example of an optoelectronic semiconductor chip.

LIST OF REFERENCES 1 first example of the optoelectronic component
2 second example of the optoelectronic component
3 third example of the optoelectronic component
4 fourth example of the optoelectronic component
5 fifth example of the optoelectronic component
6 sixth example of the optoelectronic component
7 display device
11 first example of the optoelectronic semiconductor chip
12 second example of the optoelectronic semiconductor chip
13 third example of the optoelectronic semiconductor chip
14 fourth example of the optoelectronic semiconductor chip
15 fifth example of the optoelectronic semiconductor chip
16 end side of the optoelectronic semiconductor chip
20 substrate
21 upper side of the substrate
31 first light-emitting section
32 second light-emitting section
33 third light-emitting section
40 layer sequence of the light-emitting sections
41 first layer sequence
42 second layer sequence
43 third layer sequence
50 active region
51 first active region
52 second active region
53 third active region
60 upper layer sequence
61 first upper layer sequence
62 second upper layer sequence
63 third upper layer sequence
70 lower layer sequence
71 first lower layer sequence
72 second lower layer sequence
73 third lower layer sequence
80 trenches
81 gaps
90 current distribution layers
91 first electrical conductive track
92 second electrical conductive track
93 third electrical conductive track
94 fourth electrical conductive track
95 finger of the first electrical conductive track
96 finger of the second electrical conductive track
97 finger of the third electrical conductive track
98 finger of the fourth electrical conductive track
100 electrically insulating material
101 electrically insulating layer
102 upper side of the insulating layer
103 first insulation section
104 second insulation section
105 further electrically insulating material
111 first recess
112 second recess
113 third recess
121 first electrical feed-throughs
122 second electrical feed-throughs
123 third electrical feed-throughs
124 fourth electrical feed-throughs
131 first insulating feed-through
132 second insulating feed-through
133 third insulating feed-through
140 carrier
141 mounting surface of the carrier
142 lower side of the carrier
143 contact pads
150 molding material
151 cavity
152 wall of the cavity
153 optical element 161 first wavelength-converting material
162 second wavelength-converting material
163 third wavelength-converting material
171 first light-guiding structure
172 second light-guiding structure
173 third light-guiding structure
180 encapsulation material
190 insulation

DETAILED DESCRIPTION

Our optoelectronic component comprises an optoelectronic semiconductor chip. The optoelectronic semiconductor chip comprises a substrate. At least two light-emitting sections are arranged laterally next to one another over an upper side of the substrate. The light-emitting sections are separately controllable. Advantageously, the optoelectronic component comprises a multiplicity of light-emitting sections that are, however, a constituent of only one optoelectronic semiconductor chip. This allows a compact structure of the optoelectronic component. Furthermore, a low interconnection outlay is required since only a single optoelectronic semiconductor chip is used. The mounting outlay is also reduced compared to optoelectronic components that comprise a plurality of optoelectronic semiconductor chips.

The light-emitting sections may generate electromagnetic radiation from different spectral ranges. Advantageously, color mixing of the electromagnetic radiation emitted by the light-emitting sections may be carried out. A color, thereby generated, of the electromagnetic radiation may be assigned to a color locus in a color space. A further advantage of the optoelectronic component is that the color locus may be angle-independent in respect of an emission characteristic of the optoelectronic component. In this way, a color impression may be independent of a viewing angle. Furthermore, only one optoelectronic semiconductor chip is required for the purpose of color mixing. For example, the optoelectronic semiconductor chip may generate electromagnetic radiation with the colors red, green and blue (RGB chip).

The light-emitting sections may be formed by a layer sequence. An active region may be formed inside the layer sequence. Trenches are formed between the light-emitting sections. The trenches fully divide the active region so that the light-emitting sections are separated from one another. Advantageously, the light-emitting sections are separated from one another by the trenches may be controlled individually. For example, the brightness of individual light-emitting sections may be regulated. A further advantage is that all the light-emitting sections are formed by only one layer sequence. This can simplify a production process of the optoelectronic component.

The light-emitting sections may be formed by a layer sequence. An active region is formed inside the layer sequence. At least one outermost layer, facing away from the active region, of the layer sequence is a current distribution layer. The current distribution layer comprises gaps. The gaps are formed between the light-emitting sections so that the light-emitting sections are separated from one another. Advantageously, the gaps in the current distribution layer make it possible for the light-emitting sections to be individually controllable. A further advantage is that the current distribution layer may generate a laterally homogeneous charge carrier current density inside a light-emitting section. This may lead to a homogeneous luminance of a light-emitting section.

The light-emitting sections may be fully separated from one another. The light-emitting sections may respectively be formed by a layer sequence. Active regions may respectively be formed within the layer sequences. The layer sequences of the different light-emitting sections may comprise different material systems. Advantageously, light-emitting sections that are respectively formed by a layer sequence that comprise different material systems may generate electromagnetic radiation from different spectral ranges without, for example, wavelength-converting elements having to be used.

The layers located on one side of the active region of all the light-emitting sections may be electrically contacted by a common electrical conductive track. The layers, located on an opposite side of the active region, of different light-emitting sections may be electrically contacted by separate electrical conductive tracks. Advantageously, the layers, electrically contacted by an electrical conductive track of different light-emitting sections may be at a common electrical potential, while the layers electrically contacted by separate electrical conductive tracks of different light-emitting sections may be at different electrical potentials. This makes it possible that the light-emitting sections may be controlled separately.

The electrical conductive tracks of different electrical poles may be arranged on opposite sides of the active region. The electrical conductive tracks respectively contacting a light-emitting section may be embedded in insulation sections. The insulation sections may be configured to electrically insulate electrical conductive tracks extending along a plurality of light-emitting sections from one another such that respectively only one light-emitting section is electrically contacted by an electrical conductive track. Advantageously, the insulation sections make it possible that light-emitting sections electrically contacted by separate electrical conductive tracks may be at different electrical potentials.

An electrically insulating material may be arranged between the light-emitting sections. Advantageously, gaps or trenches between the light-emitting sections may be filled by the insulating material. In this way, electrical conductive tracks may be arranged along a plurality of light-emitting sections and over the gaps or trenches.

The electrical conductive tracks may be accessible on an end side, formed perpendicularly to the upper side, of the optoelectronic semiconductor chip. Advantageously, this makes electrical contacting of the optoelectronic semiconductor chip possible.

A wavelength-converting material may be arranged on at least one light-emitting section and covers the light-emitting section at least in sections. The wavelength-converting material does not necessarily cover any other light-emitting section. Advantageously, the wavelength-converting material may be configured to modify a wavelength of the electromagnetic radiation emitted by the light-emitting section covered at least in sections. When all the light-emitting sections are formed by a layer sequence, the wavelength-converting material makes it possible that electromagnetic radiation from different spectral ranges may be generated.

The wavelength-converting material may fully cover the light-emitting section. Advantageously, all the electromagnetic radiation of the light-emitting section covered by the wavelength-converting material strikes the wavelength-converting material so that a large part of the emitted electromagnetic radiation is converted.

The wavelength-converting material may annularly enclose the substrate. If the optoelectronic semiconductor chip is configured as a volume-emitting optoelectronic semiconductor chip, i.e., the substrate is to a large part configured to be transparent for the emitted electromagnetic radiation, the wavelength-converting material annularly enclosing the substrate makes it possible for a large part of the emitted electromagnetic radiation to be modified.

The optoelectronic component may comprise a further wavelength-converting material. The further wavelength-converting material at least in sections may cover a light-emitting section not covered by the wavelength-converting material. The further wavelength-converting material does not necessarily cover any other light-emitting section. Advantageously, the further wavelength-converting material is intended to generate electromagnetic radiation from a further spectral range.

The optoelectronic component may comprise a carrier. The optoelectronic semiconductor chip may be arranged with an end side, formed perpendicularly to the upper side of the substrate, over a mounting surface of the carrier. A molding material may be arranged over the mounting surface of the carrier. The molding material may form a cavity, the optoelectronic semiconductor chip being arranged in the cavity. Advantageously, the optoelectronic semiconductor chip arranged in the cavity of the molding material is protected better against external influences, for instance moisture or mechanical stress.

The wavelength-converting material and/or the further wavelength-converting material may extend from the optoelectronic semiconductor chip as far as the molding material. Advantageously, the cavity is in this way filled to a large part with the wavelength-converting material and/or with the further wavelength-converting material. A likelihood of converting emitted electromagnetic radiation therefore increases.

An encapsulation material may be arranged in the cavity. The optoelectronic semiconductor chip, the wavelength-converting material and (if present) the further wavelength-converting material may be embedded in the encapsulation material. Advantageously, the encapsulation material protects the optoelectronic semiconductor chip against external influences.

The encapsulation material may comprise embedded particles. Advantageously, the embedded particles may be configured to scatter the electromagnetic radiation emitted by the light-emitting sections. In this way, extraction of electromagnetic radiation may be improved since the electromagnetic radiation that is scattered at the particles embedded in the encapsulation material can escape from the cavity.

At least one light-guiding structure may be arranged in the cavity. The light-guiding structure may extend from the region not covered by the wavelength-converting material of the light-emitting section as far as the molding material. The light-guiding structure may be formed running parallel to the end side of the optoelectronic semiconductor chip. The light-guiding structure may annularly enclose the substrate. The wavelength-converting material may be arranged over the light-guiding structure in relation to the end side. Advantageously, the light-guiding structure arranged in the cavity may be intended to distribute the electromagnetic radiation emitted by the optoelectronic semiconductor chip homogeneously inside the cavity. Since the wavelength-converting material is arranged over the light-guiding structure, the electromagnetic radiation distributed by the light-guiding structure may be modified in respect of its wavelength before it emerges from the cavity.

The optoelectronic component may comprise a further light-guiding structure. The light-guiding structure and the further light-guiding structure may extend starting from different light-emitting sections into the cavity. Advantageously, two light-guiding structures may respectively distribute the electromagnetic radiation respectively generated by different light-emitting sections homogeneously in the cavity.

Our display device comprises an arrangement consisting of a multiplicity of optoelectronic components. Advantageously, the display device may, for example, be a color display screen. The color display screen may, for example, be configured to generate electromagnetic radiation from three different spectral ranges. For example, the display device may generate red, green and blue light and therefore be an RGB display screen.

The above-described properties, features and advantages as well as the way in which they are achieved will become more clearly and readily comprehensible in conjunction with the following description of examples that will be explained in more detail in connection with the drawings.

FIG. 1 shows a first example of an optoelectronic semiconductor chip 11 in a schematic perspective view.

The optoelectronic semiconductor chip 11 comprises a substrate 20. The substrate 20 may, for example, be a sapphire substrate or a glass substrate. The substrate 20 may, however, also, for example, comprise a metal, semiconductor or a semiconductor oxide.

Over an upper side 21 of the substrate 20, in the example represented in FIG. 1, three light-emitting sections 31, 32, 33 are arranged laterally next to one another. The light-emitting sections 31, 32, 33 are configured to generate electromagnetic radiation. It is not, however, absolutely necessary for the optoelectronic semiconductor chip 11 to comprise precisely three light-emitting sections 31, 32, 33. The optoelectronic semiconductor chip 11 may also comprise a different number of light-emitting sections 31, 32, 33. However, the optoelectronic semiconductor chip 11 comprises at least two light-emitting sections 31, 32, 33. In the description below, only the variant in which the optoelectronic semiconductor chip 11 comprises a first light-emitting section 31, a second light-emitting section 32 and a third light-emitting section 33 is described by way of example.

The first light-emitting section 31 is formed by a first layer sequence 41. The second light-emitting section 32 is formed by a second layer sequence 42. The third light-emitting section 33 is formed by a third layer sequence 43. The first layer sequence 41 comprises a first upper layer sequence 61 and a first lower layer sequence 71. The second layer sequence 42 comprises a second upper layer sequence 62 and a second lower layer sequence 72. The third layer sequence 43 comprises a third upper layer sequence 63 and a third lower layer sequence 73. The upper layer sequences 61, 62, 63 may, for example, comprise p-doping. The lower layer sequences 71, 72, 73 may, for example, comprise n-doping. The dopings of the upper layer sequences 61, 62, 63 and of the lower layer sequences 71, 72, 73 may, however, also be interchanged.

A first active region 51 is formed inside the first layer sequence 41. A second active region 52 is formed inside the second layer sequence 42. A third active region 53 is formed inside the third layer sequence 43. The active regions 51, 52, 53 are respectively arranged between the upper layer sequences 61, 62, 63 and the lower layer sequences 71, 72, 73 of a light-emitting section 31, 32, 33.

Generation of electromagnetic radiation can take place inside the active regions 51, 52, 53 because of charge carrier recombination. To this end, the active regions 51, 52, 53 may, for example, comprise multiple quantum wells. The optoelectronic semiconductor chip 11 is thus configured as a light-emitting diode having three light-emitting sections 31, 32, 33.

The first layer sequence 41, the second layer sequence 42 and the third layer sequence 43 comprise different material systems. In the representation of FIG. 1, for the sake of simplicity, all the upper layer sequences 61, 62, 63 have identical thicknesses. All the active regions 51, 52, 53 likewise have identical thicknesses. The same applies for all the lower layer sequences 71, 72, 73 that they have identical thicknesses. This, however, is not absolutely necessary. The thicknesses of the upper layer sequences 61, 62, 63 may be different. The thicknesses of the active regions 51, 52, 53 may also be different. Likewise, the thicknesses of the lower layer sequences 71, 72, 73 may be different. Because of the different material systems, the light-emitting sections 31, 32, 33 may be configured to generate electromagnetic radiation from different spectral ranges.

A trench 80 is respectively formed between the first layer sequence 41 and the second layer sequence 42, and between the second layer sequence 42 and the third layer sequence 43. By the trenches 80, the layer sequences 41, 42, 43 of different material systems are arranged spaced apart from one another over the upper side 21 of the substrate 20 and fully separated from one another. This allows separate controlling of the light-emitting sections 31, 32, 33.

The individual layer sequences 41, 42, 43 may, for example, be arranged laterally next to one another by thin-film transfer over the upper side 21 of the substrate 20, after they have respectively been produced beforehand on a growth substrate. The layer sequences 41, 42, 43 comprising different material systems may, for example, respectively be produced epitaxially on a suitable substrate before they are transferred onto the substrate 20. Production of the trenches 80 is in this example carried out by arranging the layer sequences 41, 42, 43 spaced apart during the thin-film transfer.

In the representation of FIG. 1, a current distribution layer 90 is respectively arranged over the upper layer sequences 61, 62, 63 of the layer sequences 41, 42, 43. The current distribution layers 90 may also be arranged below the lower layer sequences 71, 72, 73 of the layer sequences 41, 42, 43. It is, however, also possible for each light-emitting section 31, 32,33 respectively to comprise two current distribution layers 90 arranged both over the upper layer sequences 61, 62, 63 and below the lower layer sequences 71, 72, 73. The current distribution layers 90 may, however, also be omitted.

The current distribution layers 90 are intended to produce homogeneous charge carrier current densities inside the light-emitting sections 31, 32, 33. Preferably, the current distribution layers 90 are arranged over or under a p-doped upper or lower layer sequence 61, 62, 63, 71, 72, 73, respectively. This is because p-doped layer sequences can typically have a higher electrical resistance than n-doped layer sequences for which reason homogenization the of charge carrier current density is more feasible in this example.

The current distribution layers 90 may, for example, comprise a transparent electrically conductive oxide (transparent conductive oxide, TCO). For example, the current distribution layers 90 may comprise indium tin oxide (ITO). Transparent electrically conductive oxides have the advantage that a large part of electromagnetic radiation from the visible range is not absorbed.

The light-emitting sections 31, 32, 33 may be controlled separately. In this way, for example, a brightness of the light-emitting sections 31, 32, 33 may be regulated independently of one another. To control the light-emitting sections 31, 32, 33 separately, the optoelectronic semiconductor chip 11 comprises in total four electrical conductive tracks 91, 92, 93, 94. The electric conductive tracks 91,92, 93,94 have an electrically conductive material. The electrical conductive tracks 91, 92, 93, 94 are configured to supply the light-emitting sections 31, 32, 33 with electrical energy. In this example, all the light-emitting sections 31, 32, 33 are electrically contacted by the fourth electrical conductive track 94. The remaining electrical conductive tracks 91, 92, 93 are used for separate electrical contacting of the light-emitting sections 31, 32, 33 and respectively form an electrical counter-pole for the fourth electrical conductive track 94.

In the example represented in FIG. 1, the fourth electrical conductive track 94 is arranged over the upper layer sequences 61, 62, 63 and on the current distribution layers 90, and electrically contacts the upper layer sequences 61, 62, 63 of the light-emitting sections 31, 32, 33. Since the fourth electrical conductive track 94 extends over the trenches 80, it is expedient for the trenches 80 to be filled with an electrically insulating material 100, for example, silicon dioxide as shown in FIG. 1. The fourth electrical conductive track 94 comprises in total six fingers 98. In each structure, two fingers 98 project onto one emitting section 31, 32, 33.

For electrical contacting of the lower layer sequences 71, 72, 73 of the light-emitting sections 31, 32, 33, the optoelectronic semiconductor chip 11 comprises recesses 111, 112, 113. The first recess 111 is intended to receive the first electrical conductive track 91. The second recess 112 is intended to receive the second electrical conductive track 92. The third recess 113 is intended to receive the third electrical conductive track 93. The recesses 111, 112, 113 extend in the representation of FIG. 1 in a direction running perpendicularly to the upper side 21 of the substrate 20 from the current distribution layers 90 as far as the upper side 21 of the substrate 20. The first, second and the third electrical conductive tracks 91, 92, 93 are in this example arranged on the upper side 21 of the substrate 20. The recesses 111,112,113 do not necessarily have to extend as far as the upper side 21 of the substrate 20. The recesses 111, 112, 113 must, however, be at least so deep that the first, the second and the third electrical conductive tracks 91, 92, 93 electrically contact only the lower layer sequences 71, 72, 73 and not, for instance, also the active regions 51, 52, 53 or the upper layer sequences 61, 62, 63. The recesses 111, 112, 113 run in a lateral direction perpendicularly to the trenches 80 and cross the trenches 80. For this reason, the recesses 111, 112, 113 are likewise filled with the electrically insulating material 100. The recesses 111, 112, 113 may, for example, be produced by an etching process.

The first electrical conductive track 91 extends only across the first light-emitting section 31 and electrically contacts its first lower layer sequence 71. The first electrical conductive track 91 comprises a finger projecting onto the first light-emitting section 31. The finger of the first electrical conductive track 91 cannot, however, be seen in FIG. 1 since it extends inside the first recess 111. As may be seen in FIG. 1, the first recess 111 extends between two fingers 98 of the fourth electrical conductive track 94 so that the fingers of the first electrical conductive track 91 project between the fingers 98 of the fourth electrical conductive track 94 onto the first light-emitting section 31.

The second electrical conductive track 92 extends across the first and the second light-emitting sections 31, 32 and electrically contacts the second lower layer sequence 72 of the second light-emitting section 32. The second electrical conductive track 92 comprises a finger projecting onto the second light-emitting section 32. The finger of the second electrical conductive track 92 likewise cannot be seen in FIG. 1 since it extends inside the second recess 112. In turn, the finger of the second electrical conductive track 92 extends between two fingers 98 of the fourth electrical conductive track 94. The second electrical conductive track 92 is intended to electrically contact only the second lower layer sequence 72 of the second light-emitting section 32. So that the second electrical conductive track 92 does not electrically contact the first lower layer sequence 71 of the first light-emitting section 31, the second electrical conductive track 92 is embedded in an insulation section, the insulation section not being shown in the representation of FIG. 1. The insulation section of the second electrical conductive track 92 extends across the first light-emitting section 31 to not electrically contact it with the second electrical conductive track 92. The insulation section may, for example, comprise silicon dioxide.

The third electrical conductive track 93 extends across the first, the second and the third light-emitting sections 31, 32, 33 and electrically contacts the third lower layer sequence 73 of the third light-emitting section 33. The third electrical conductive track 93 comprises a finger projecting onto the third light-emitting section 33. The finger of the third electrical conductive track 93 likewise cannot be seen in FIG. 1 since it extends inside the third recess 113. In turn, the finger of the third electrical conductive track 93 extends between two fingers 98 of the fourth electrical conductive track 94. The third electrical conductive track 93 is intended to electrically contact only the third lower layer sequence 73 of the third light-emitting section 33. So that the third electrical conductive track 93 does not electrically contact the first and second lower layer sequences 71, 72 of the first and second light-emitting sections 31, 32, respectively, the third electrical conductive track 93 is embedded in a further insulation section, the further insulation section not being shown in the representation of FIG. 1. The further insulation section of the third electrical conductive track 93 extends across the first and second light-emitting sections 31, 32 to not electrically contact them with the third electrical conductive track 93 and likewise may, for example, comprise silicon dioxide.

The second electrical conductive track 92 and the third electrical conductive track 93 that respectively contact separate light-emitting sections 32, 33 are thus embedded in insulation sections configured to electrically insulate electrical conductive tracks 92, extending along a plurality of light-emitting sections 32, 33 such that respectively only one light-emitting section 32, 33 is electrically contacted with an electrical conductive track 92, 93. Since the first electrical conductive track 91 extends only across the first light-emitting section 31, the first electrical conductive track 91 is not embedded in an insulation section.

To arrange the second and third electrical conductive tracks 92, 93 in the second and third recesses 112, 113, respectively, a material of the insulation sections may initially be arranged in the second and third recesses 112, 113, for example, by a sputtering process. Following this, the electrical conductive tracks 91, 92, 93 may be arranged in the recesses 111, 112, 113, likewise by a sputtering process. Finally, the material of the insulation sections may again be arranged in the second and third recesses 112, 113. In this way, the second and the third electrical conductive tracks 92, 93 are embedded in the insulation sections. When arranging the second and the third electrical conductive tracks 92, 93, it is necessary to ensure that a width of the second and the third electrical conductive tracks 92, 93 is less than a width of the second and third recesses 112, 113. This may, for example, be ensured by a shadow mask. This procedure is necessary so that the second electrical conductive track 92 does not electrically contact the first light-emitting section 31 and the third electrical conductive track 93 does not electrically contact the first and the second light-emitting sections 31, 32. If the width of the second and third electrical conductive tracks 92, 93 is less than the width of the second and third recesses 112, 113, the second and the third electrical conductive tracks 92, 93 can be embedded in the material of the insulation sections when again arranging the material of the insulation sections in the recesses 112, 113.

In contrast to the fourth electrical conductive track 94, the first, the second and the third electrical conductive tracks 91, 92, 93 respectively comprise only one finger, that respectively projects onto one light-emitting section 31, 32, 33. This may, however, apply the other way around. It is, however, expedient for the electrical conductive tracks that electrically contact a p-doped upper or lower layer sequence to comprise two fingers projecting onto one light-emitting section 31, 32, 33. This is in turn related to a potentially inferior electrical conductivity of a p-doped upper or lower layer sequence compared to an n-doped upper or lower layer sequence. To produce a maximally homogeneous charge carrier current density inside a p-doped upper or lower layer sequence, an electrical conductive track preferably comprises a plurality of fingers that project onto the light-emitting sections 31, 32, 33.

It is also possible for the fourth electrical conductive track 94 to electrically contact the lower layer sequences 71, 72, 73, while the first, the second and the third electrical conductive tracks 91, 92, 93 electrically contact the upper layer sequences 61, 62, 63. In this example, only one recess for the fourth electrical conductive track 94 is required, while the first, the second and the third electrical conductive tracks 91, 92, 93 are arranged over the upper layer sequences 61, 62, 63. An insulation section for the fourth electrical conductive track 94 is obviated in this example, since the fourth electrical conductive track 94 electrically contacts all the light-emitting sections 31, 32, 33.

The fourth electrical conductive track 94 is intended to be at one electrical potential, while the first electrical conductive track 91, the second electrical conductive track 92 and the third electrical conductive track 93 may respectively be at different electrical potentials. This allows separate control of the light-emitting sections 31, 32, 33.

All the electrical conductive tracks 91, 92, 93, 94 are accessible on an end side 16, formed perpendicularly to the upper side 21 of the substrate 20, of the optoelectronic semiconductor chip 11. In other words, end surfaces of the electrical conductive tracks 91, 92, 93, 94 are exposed on the end side 16 of the optoelectronic semiconductor chip 11. The optoelectronic semiconductor chip 11 may therefore be arranged with its end side 16 over a carrier such that the end surfaces of the electrical conductive tracks 91, 92, 93, 94 are in electrical contact with contact areas or contact tracks arranged on the carrier.

In principle, however, it is not absolutely necessary for the electrical conductive tracks 91, 92, 93, 94 to be arranged running exactly in the manner shown in FIG. 1. For example, the electrical conductive tracks 91, 92, 93, 94 may also be led out in a direction parallel to the end side 16.

Figure 2:
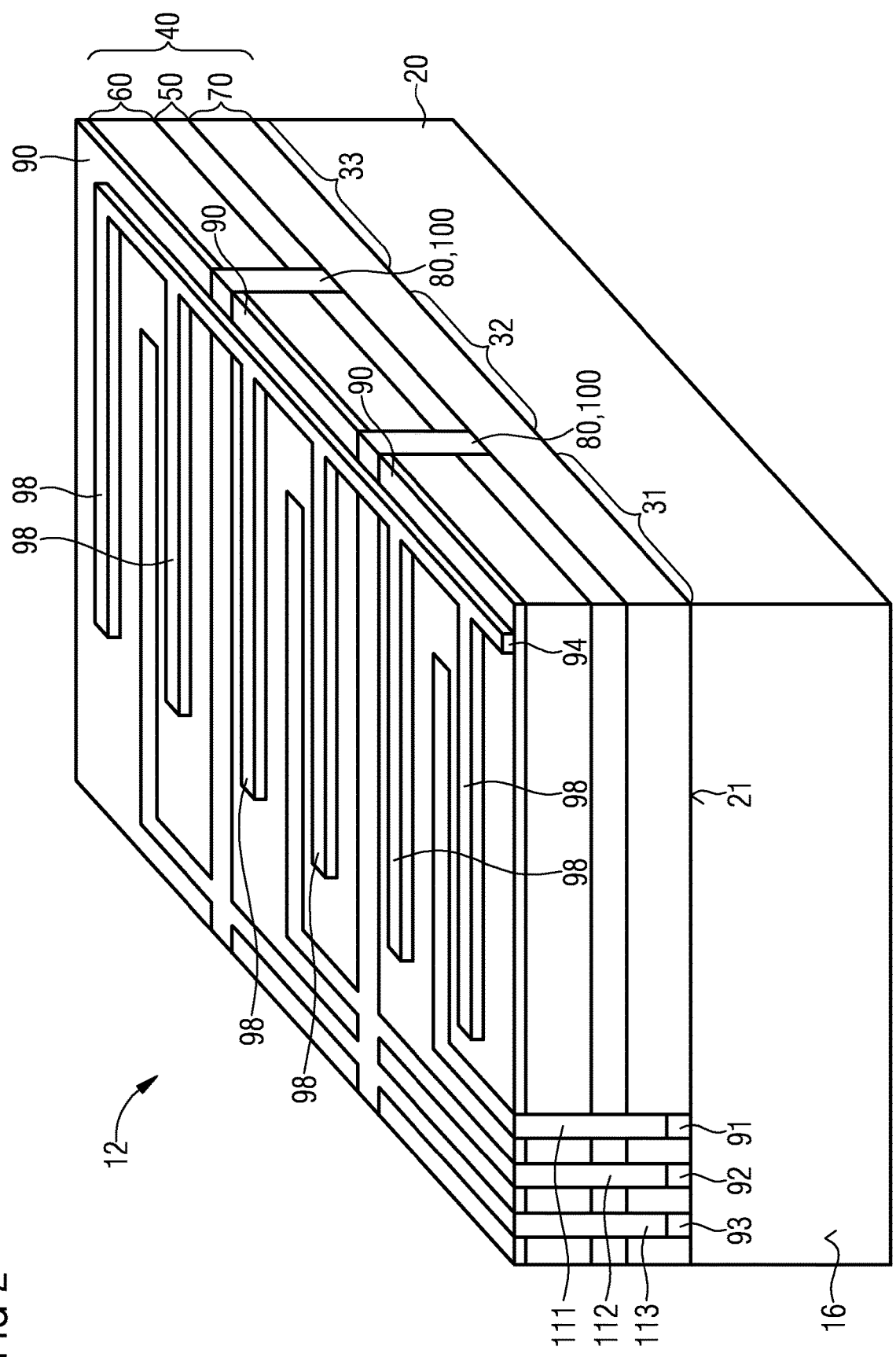
FIG. 2 schematically shows a perspective view of a second example of an optoelectronic semiconductor chip.

FIG. 2 shows an optoelectronic semiconductor chip 12 according to a second example in a schematic perspective view. The second example of the optoelectronic semiconductor chip 12 has great similarities with the first example of the optoelectronic semiconductor chip 11. Only the differences will be explained in the description below.

The optoelectronic semiconductor chip 12 according to the second example comprises light-emitting sections 31, 32, 33 formed by a common layer sequence 40 of one material system. In this variant of the optoelectronic semiconductor chip 12, the layer sequence 40 may be produced directly on the substrate 20, for example, by epitaxy. Thin-film transfer is thus not absolutely necessary.

If the light-emitting sections 31, 32, 33 are formed by a common layer sequence 40, the light-emitting sections 31, 32, 33 may be separated from one another in different ways.

One possibility consists of forming trenches 80 inside the layer sequence 40 in a direction perpendicular to the upper side 21 of substrate 20. The trenches 80 may, for example, be produced by an etching method. The trenches 80 are formed such that they fully divide at least one active region 50 of the layer sequence 40 so that the light-emitting sections 31, 32, 33 are separated from one another. The trenches 80 may in this example be configured such that the active region 50 and an upper layer sequence 60 of the layer sequence 40 are separated from one another. This corresponds to the representation of FIG. 2, in which a lower layer sequence 70 of the layer sequence 40 is not divided by the trenches 80. The lower layer sequence 70 may, however, also be divided by the trenches 80 so that the light-emitting sections 31, 32, 33 are fully separated from one another.

The electrical contacting of the light-emitting sections 31, 32, 33 is carried out in accordance with the first example of the optoelectronic semiconductor chip 11.

Figure 3:
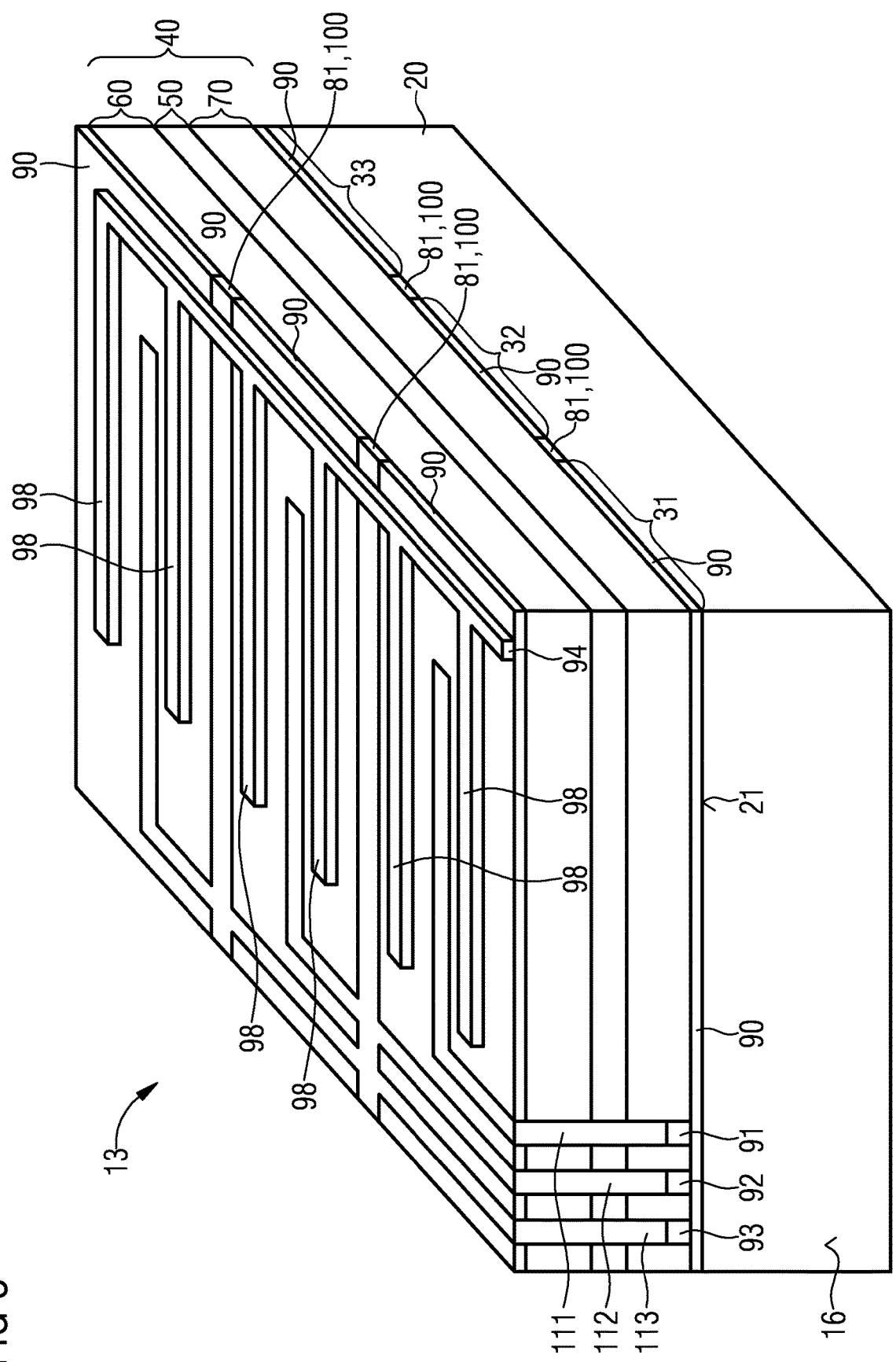
FIG. 3 schematically shows a perspective view of a third example of an optoelectronic semiconductor chip.

FIG. 3 shows an optoelectronic semiconductor chip 13 according to a third example in a schematic perspective view. The third example of the optoelectronic semiconductor chip 13 has great similarities with the second example of the optoelectronic semiconductor chip 12. Only the differences will be explained in the description below.

Besides FIG. 2, FIG. 3 shows a further possibility of separating the light-emitting sections 31, 32, 33 of a layer sequence 40 from one another, without producing trenches 80 between the light-emitting sections 31, 32, 33, i.e., the layer sequence 40 of one material system remains fully continuous. In this example, current distribution layers 90 are used, which comprise gaps 81 between the light-emitting sections 31, 32, 33. This may make it possible to restrict a charge carrier flow inside the layer sequence 40 substantially to a region that is defined by current distribution layers 90 applied on the upper side and/or on the lower side. Formation of the trenches 80 may therefore be obviated. Substantially no charge carrier recombination therefore takes place in the region of the gaps 81 so that the light-emitting sections 31, 32, 33 are separated from one another.

The gaps 81 in the current distribution layers 90 may, for example, be produced by an etching method. It is, however, also possible to arrange individual current distribution layers 90 at a distance from one another so that the gaps 81 are formed by spacings. Expediently, the gaps 81 are filled with the electrically insulating material 100.

In the representation of FIG. 3, the optoelectronic semiconductor chip 13 comprises in total six current distribution layers 90. Each light-emitting section 31, 32, 33 in this example comprises two current distribution layers 90 respectively arranged on the upper layer sequence 60 and the lower layer sequence 70. It may, however, be sufficient to provide only the upper or only the lower layer sequence 60, 70 with three current distribution layers 90 for the three light-emitting sections 31, 32, 33. In particular, it may be sufficient to arrange current distribution layers 90 only on p-doped layer sequences, since p-doped layer sequences may typically have an inferior electrical conductivity to n-doped layer sequences.

Figure 4:
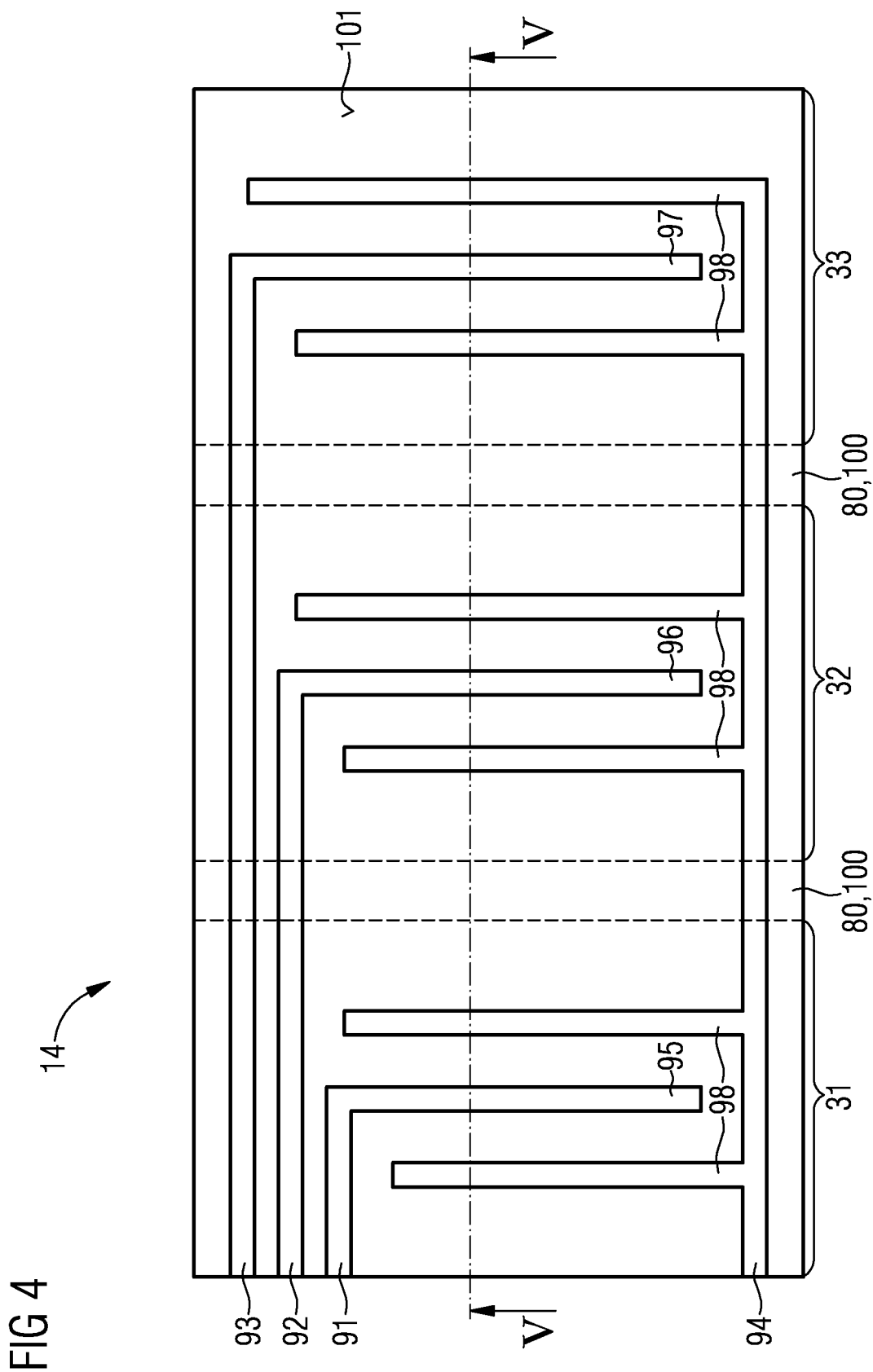
FIG. 4 schematically shows a plan view of a fourth example of an optoelectronic semiconductor chip.
Figure 5:
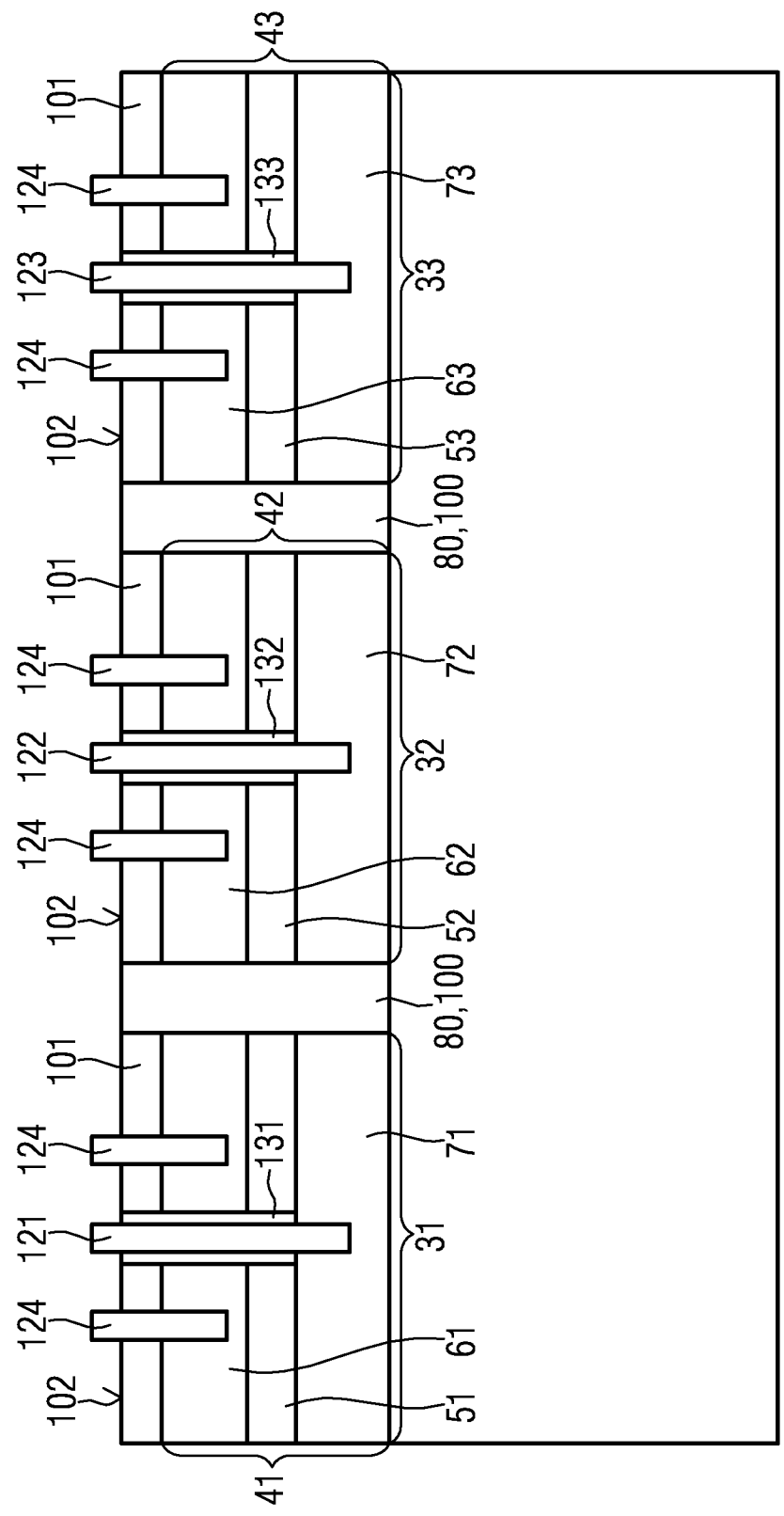
FIG. 5 schematically shows a lateral sectional view of the fourth example of the optoelectronic semiconductor chip.

FIG. 4 shows an optoelectronic semiconductor chip 14 according to a fourth example in a schematic plan view. FIG. 5 shows a lateral sectional view of the fourth example of the optoelectronic semiconductor chip 14 according to a line represented by dashes and marked with arrows in FIG. 4.

Like the first example of the optoelectronic semiconductor chip 11, the fourth example of the optoelectronic semiconductor chip 14 comprises three light-emitting sections 31, 32, 33 respectively comprising layer sequences 41, 42, 43 of different material systems. The essential difference of the fourth example from the first example consists in the electrical contacting of the upper and lower layer sequences 61, 62, 63, 71, 72, 73. Furthermore, the optoelectronic semiconductor chip 14 according to the fourth example does not comprise current distribution layers.

In the plan view of FIG. 4, the light-emitting sections 31, 32, 33 may be seen that are separated from one another by trenches 80 filled with the electrically insulating material 100, which is indicated by dashed lines. The electrical conductive tracks 91, 92, 93, 94 may furthermore be seen. All the electrical conductive tracks 91, 92, 93, 94 are arranged on the upper side, i.e., no recesses were produced to arrange the electrical conductive tracks 91, 92, 93, 94 therein. So that the electrical conductive tracks 91, 92, 93, 94 do not electrically contact all the upper layer sequences 61, 62, 63, the electrical conductive tracks 91, 92, 93, 94 are arranged on an electrically insulating layer 101 that may, for example, comprise silicon dioxide.

The fourth electrical conductive track 94 is intended to electrically contact the upper layer sequences 61, 62, 63. To this end, the fingers 98 of the fourth electrical conductive track 94 are connected to electrical feed-throughs 124. The electrical feed-throughs 124 are formed running perpendicularly to the fingers 98, and extend through the electrically insulating layer 101 as far as the upper layer sequences 61, 62, 63 and electrically contact the upper layer sequences 61, 62, 63. Each finger 98 may be connected to any desired number of electrical feed-throughs 124. In FIG. 5, however, only one electrical feed-through 124 per finger 98 is shown. Further electrical feed-throughs are located in front of or behind the electrical feed-throughs 124 shown. All the upper layer sequences 61, 62, 63 may therefore be at a common electrical potential.

The fingers 95, 96, 97 of the first, the second and the third electrical conductive tracks 91, 92, 93 are also connected to electrical feed-throughs 121, 122, 123 respectively formed running perpendicularly to the fingers 95, 96, 97. The electrical feed-throughs 121, 122, 123 extend through the insulating layer 101, through the upper layer sequences 61, 62, 63 and through the active regions 51, 52, 53 as far as the lower layer sequences 71, 72, 73, and electrically contact the lower layer sequences 71, 72, 73.

So that the electrical feed-throughs 121, 122, 123 do not electrically contact the upper layer sequences 61, 62, 63 and the active regions 51, 52, 53, the electrical feed-throughs 121, 122, 123 are respectively embedded in an insulating feed-through 131, 132, 133. The insulating feed-throughs 131, 132, 133 comprise, for example, silicon dioxide. The insulating feed-throughs 131, 132, 133 respectively extend from an upper side 102 of the insulating layer 101 as far as an interface formed between the active regions 51, 52, 53 and the lower layer sequences 71, 72, 73.

Each finger 95, 96, 97 may respectively be connected to any desired number of electrical feed-throughs 121, 122,

123. In FIG. 5, however, only one electrical feed-through 121, 122, 123 per finger 95, 96, 97 is shown. Further electrical feed-throughs are located in front of or behind the electrical feed-throughs 121, 122, 123 shown. The lower layer sequences 71, 72, 73 may therefore be at a common electrical potential.

It is also possible for the fourth electrical conductive track 94 to electrically contact all the lower layer sequences 71, 72, 73, while the first, the second and the third electrical conductive tracks 91, 92, 93 respectively electrically contact one upper layer sequence 61, 62, 63. In this example, the electrical feed-throughs 124 of the fourth electrical conductive track are embedded in insulating feed-throughs.

FIG. 6 shows an optoelectronic semiconductor chip 15 according to a fifth example in a schematic plan view. FIG. 7 shows a lateral sectional view of the fifth example of the optoelectronic semiconductor chip 15 according to a line represented by dashes and marked with arrows in FIG. 6.

Like the first, the second, third and the fourth examples of the optoelectronic semiconductor chip 11, 12, 13, 14, the fifth example of the optoelectronic semiconductor chip 15 comprises three light-emitting sections 31, 32, 33 that may respectively comprise layer sequences of different material systems or a uniform layer sequence of only one material system. The essential difference of the fifth example from the first, the second, third and the fourth examples of the optoelectronic semiconductor chip 11, 12, 13, 14 consists of the electrical contacting of the upper and lower layer sequences.

In the plan view of FIG. 6, the light-emitting sections 31, 32, 33 may be seen, which are separated from one another by trenches 80 filled with the electrically insulating material 100 as indicated by dashed lines. Each light-emitting section 31, 32, 33 comprises a current distribution layer 90 arranged on the upper side. Three electrical conductive tracks 91, 92, 93 may furthermore be seen. The three electrical conductive tracks 91, 92, 93 are arranged on the upper side, i.e., no recesses were produced to arrange the electrical conductive tracks 91, 92, 93 therein. By way of example, each of the three electrical conductive tracks 91, 92, 93 comprises a finger 95, 96, 97 that respectively projects onto a light-emitting section 31, 32, 33 and respectively electrically contacts one upper layer sequence.

So that the second and the third electrical conductive tracks 92, 93 do not electrically contact all the upper layer sequences, the second and the third electrical conductive tracks 92, 93 are respectively embedded in a first and a second insulation section 103, 104. The first insulation section 103 extends from the end side 16 as far as the third light-emitting section 33. The third electrical conductive track 93 is embedded in the first insulation section 103 in this region. The second insulation section 104 extends from the end side 16 as far as the second light-emitting section 32. The second electrical conductive track 92 is embedded in the second insulation section 104 in this region. The first electrical conductive track 91 electrically contacts only the first light-emitting section 31, and for this reason is not embedded in an insulation section. All the upper layer sequences may therefore be at different electrical potentials.

The fourth electrical conductive track cannot be seen in the representation of FIG. 6 since it extends inside the optoelectronic semiconductor chip 15. The fourth electrical conductive track 94 extends from the end side 16 as far as the third light-emitting section 33 and contacts all the lower layer sequences.

FIG. 7 shows a lateral sectional view through the second light-emitting section 32. Over the current distribution layer 90, the second and the third electrical conductive tracks 92, 93 and a second finger 96 of the second electrical conductive track 92 may be seen. The third electrical conductive track 93 is embedded in the first insulation section 103.

As may be seen in FIG. 7, the second upper layer sequence 62 and the second active region 52 are divided by a further electrically insulating material 105 along a direction perpendicular to the end side 16. The fourth electrical conductive track 94 is embedded in the further insulating material 105 to not electrically contact the second upper layer sequence 62 and the second active region 52. The fourth electrical conductive track 94 is connected to a fourth electrical feed-through 124 formed running perpendicularly to the fourth electrical conductive track 94. The fourth electrical feed-through 124 extends as far as the second lower layer sequence 72, and electrically contacts the second lower layer sequence 72. The fourth electrical conductive track 94 may also be connected to a multiplicity of fourth electrical feed-throughs 124 that electrically contact the second lower layer sequence 72. These cannot be seen in the representation of FIG. 7 since they may be located in front of or behind the fourth electrical feed-through 124 shown.

The fourth electrical conductive track 94 also contacts the first and the third upper layer sequence of the optoelectronic semiconductor chip 15, although this cannot be seen in the representation of FIG. 7 since it is a sectional view through only the second light-emitting section 32. All the lower layer sequences may therefore be at a common electrical potential.

FIG. 8 shows a schematic lateral sectional view of an optoelectronic component 1 according to a first example.

The optoelectronic component 1 comprises a carrier 140, according to the first example the optoelectronic semiconductor chip 11 being arranged with the end side 16 over a mounting surface 141 of the carrier 140. Instead of the optoelectronic semiconductor chip 11, one of the optoelectronic semiconductor chips 12, 13, 14, 15 according to FIGS. 2 to 7 could also be arranged over the mounting surface 141. The light-emitting sections 31, 32, 33 of the optoelectronic semiconductor chip 11 may be seen. The trenches, or gaps, between the light-emitting sections 31, 32, 33 are not represented for reasons of clarity. The electrical conductive tracks have also been omitted from the representation for this reason.

A molding material 150 is arranged over the mounting surface 141 of the carrier 140, the molding material 150 forming a cavity 151, the wall 152 of which is configured obliquely to the mounting surface 141 of the carrier 140, the cavity 151 being conically open. The mounting surface 141 is exposed at a bottom of the cavity 151. The optoelectronic semiconductor chip 11 is arranged in the cavity 151. The molding material 150 may comprise a plastic, for example, a polyphthalamide. The molding material 150 may, for example, be arranged over the mounting surface 141 of the carrier 140 by a molding method, for example, by compression molding or transfer molding.

The molding material 150 may comprise embedded particles. The particles are intended to scatter electromagnetic radiation. The particles may, for example, comprise silicon dioxide or titanium dioxide. Electromagnetic radiation emitted by the optoelectronic semiconductor chip 11 may be reflected at the particles and thus emerge from the cavity 151 with a higher yield.

Four contact pads 143 are arranged on a lower side 142 of the carrier 140. The contact pads 143 enable electrical contacting of the optoelectronic semiconductor chip 11. The contact pads 143 comprise an electrically conductive material and are electrically conductively connected to the electrical conductive tracks of the optoelectronic semiconductor chip 11. To this end, the carrier 140 may, for example, comprise electrically conductive feed-throughs that are exposed on the mounting surface 141 and are electrically connected to electrical contact areas or contact tracks arranged on the mounting surface 141. The optoelectronic semiconductor chip 11 may be arranged with the end surfaces of the electrical conductive tracks on the electrical contact areas or contact tracks.

An optical element 153 is arranged over the cavity 151. The optical element 153 may, for example, be a lens. In the representation of FIG. 8, the optical element 153 is configured as convex lenses. This, however, is not absolutely necessary. The optical element 153 may also be configured as a concave lens. The optical element 153 may comprise a plastic, for example, silicone. The optical element 153 may, for example, be arranged over the cavity 151 by a molding method, for example, by compression molding or transfer molding. The optical element 153 may, however, also be omitted.

If the light-emitting sections 31, 32, 33 are formed by one material system, the light-emitting sections 31, 32, 33 are configured to generate electromagnetic radiation from a common spectral range. To generate electromagnetic radiation from different spectral ranges, however, wavelength-converting materials 161, 162, 163 may be used.

In the representation of FIG. 8, three wavelength-converting materials 161, 162, 163 are arranged in the cavity 151 and around the light-emitting sections 31, 32, 33. The wavelength-converting materials 161, 162, 163 cover the light-emitting sections 31, 32, 33 fully. In this example, each wavelength-converting material 161, 162, 163 respectively covers only one light-emitting section 31, 32, 33, and no other light-emitting section 31, 32, 33. The wavelength-converting materials 161, 162, 163 annularly enclose the optoelectronic semiconductor chip 11.

The wavelength-converting materials 161, 162, 163 may, for example, comprise a plastic, for example, silicone. Wavelength-converting particles are respectively embedded in the plastic. To generate electromagnetic radiation from different spectral ranges, the different wavelength-converting materials 161, 162, 163 comprise different wavelength-converting particles.

In contrast to the representation of FIG. 8, when there are three light-emitting sections 31, 32, 33 of the optoelectronic semiconductor chip 11, for example, only two of the three light-emitting sections 31, 32, 33 may be covered by a wavelength-converting material 161, 162, 163. If all the light-emitting sections 31, 32, 33 are, for example, configured to emit blue light, it may be expedient to encase only two of the light-emitting sections 31, 32, 33 with a wavelength-converting material 161, 162, 163 to generate light of other colors, example red and green, while the blue light of the third light-emitting section 31, 32, 33 remains unchanged. In this example, the light-emitting section 31, 32, 33 whose electromagnetic radiation is not intended to be converted may merely be surrounded by the plastic, without the plastic comprising embedded wavelength-converting particles.

The wavelength-converting materials 161, 162, 163 may, for example, be arranged in the cavity 151 by a dosing method. This is done after the optoelectronic semiconductor chip 11 has been arranged with the end side 16 over the mounting surface 141 of the carrier 140.

FIG. 9 shows a schematic lateral sectional view of an optoelectronic component 2 according to a second example. The second example of the optoelectronic component 2 has great similarities with the first example of the optoelectronic component 1. Only the differences will be explained in the description below.

In the second example of the optoelectronic component 2, besides the optoelectronic semiconductor chip 11 and the wavelength-converting materials 161, 162, 163, three light-guiding structures 171, 172, 173 are arranged in the cavity 151. The wavelength-converting materials 161, 162, 163 cover the light-emitting sections 31, 32, 33 only in sections. The light-guiding structures 171, 172, 173 extend from the regions, not covered by the wavelength-converting materials 161, 162, 163, of the light-emitting sections 31, 32, 33 as far as the wall 152 of the cavity 151. The wavelength-converting materials 161, 162, 163 and the light-guiding structures 171, 172, 173 are formed running parallel to the end side 16 of the optoelectronic semiconductor chip 11, and annularly enclose the optoelectronic semiconductor chip 11. The wavelength-converting materials 161, 162, 163 are arranged over the light-guiding structures 171, 172, 173 in relation to the end side 16 of the optoelectronic semiconductor chip 11. The light-guiding structures 171, 172, 173 are configured to distribute the electromagnetic radiation homogeneously inside the cavity 151. In this way, an intensity of the electromagnetic radiation emerging from the cavity 151 may be distributed spatially uniformly.

The light-guiding structures 171, 172, 173 may, for example, comprise glass or a plastic, for example, silicone. If the light-guiding structures 171, 172, 173 comprise a plastic, the light-guiding structures 171, 172, 173 may, for example, be arranged in the cavity 151 by a dosing method. The wavelength-converting materials 161, 162, 163 and the light-guiding structures 171, 172, 173 may be arranged alternately in the cavity 151.

Figure 10:
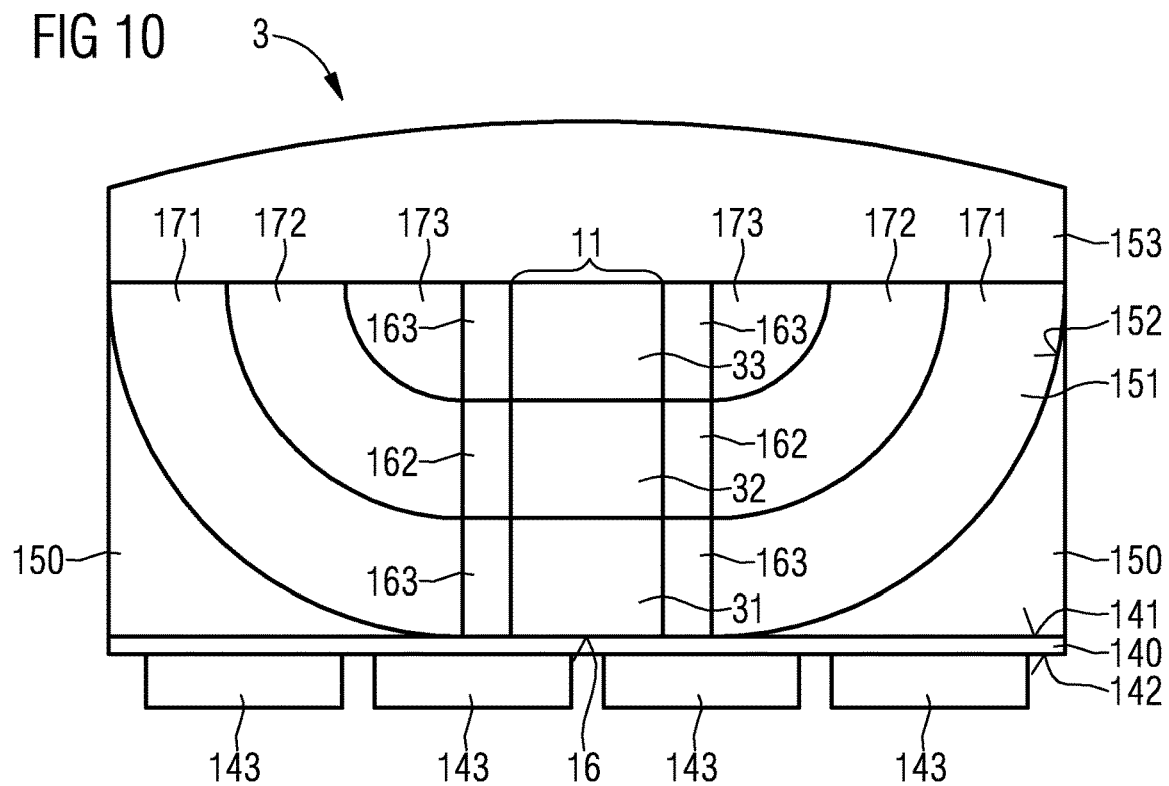
FIG. 10 schematically shows a lateral sectional view of a third example of an optoelectronic component.
Figure 11:
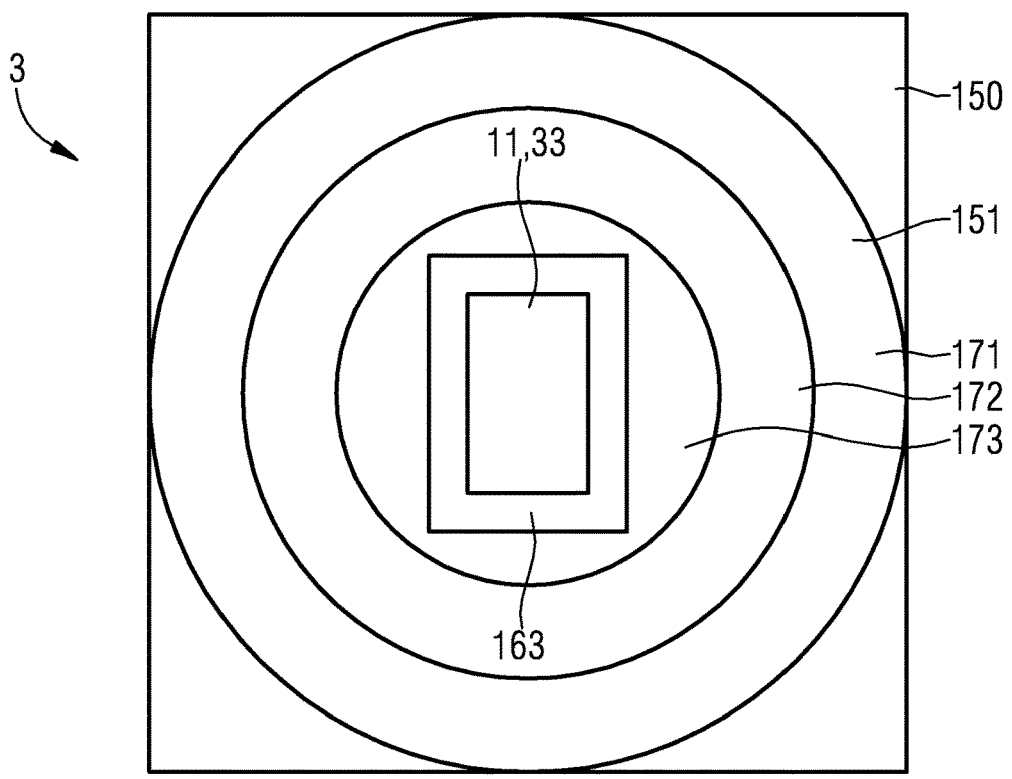
FIG. 11 schematically shows a plan view of the third example of the optoelectronic component.

FIG. 10 shows a schematic lateral sectional view of an optoelectronic component 3 according to a third example. FIG. 11 shows a schematic plan view of the third example of the optoelectronic component 3. The third example of the optoelectronic component 3 has great similarities with the first and second examples of the optoelectronic component 1, 2. Only the differences will be explained in the description below.

In contrast to the first example of the optoelectronic component 1, in the third example of the optoelectronic component 3 the wavelength-converting materials 161, 162, 163 do not extend as far as the wall 152 of the cavity 151 so that the wall 152 is free of the wavelength-converting materials 161, 162, 163. In the example represented, only the first wavelength-converting material 161 extends in the region of the mounting surface 141 as far as the molding material 150, the first wavelength-converting material 161 likewise not covering the wall 152. In this way, the cavity 151 is not fully filled with the wavelength-converting materials 161, 162, 163.

To arrange the wavelength-converting materials 161, 162, 163 as shown in FIG. 10, the optoelectronic semiconductor chip 11 may initially be arranged in a cavity of an auxiliary molded body. The cavity of the auxiliary molded body may be filled in stages with the wavelength-converting materials 161, 162, 163. The auxiliary molded body may subsequently be removed. In this way, it is possible to obtain an optoelectronic semiconductor chip 11 whose light-emitting sections 31, 32, 33 are respectively enclosed annularly by the wavelength-converting materials 161, 162, 163. The optoelectronic semiconductor chip 11 enclosed by the wavelength-converting materials 161, 162, 163 may then be used to produce the optoelectronic component 3.

In contrast to the second example of the optoelectronic component 2, the optoelectronic component 3 according to the third example comprises light-guiding structures 171, 172, 173 configured to be curved rather than planar. The wall 152 of the cavity 151 is also configured to be curved. The light-guiding structures 171, 172, 173 extend in the shape of a bowl in a curved fashion respectively from a wavelength-converting material 161, 162, 163 as far as the optical element 153. Such a curvature of the light-guiding structures 171, 172, 173 makes it possible to extract electromagnetic radiation emitted by the light-emitting sections 31, 32, 33 and converted by the wavelength-converting materials 161, 162, 163 directly from the cavity 151.

The curved light-guiding structures 171, 172, 173 may, for example, be arranged in the cavity 151 by successive arrangement. If the light-guiding structures 171, 172, 173 comprise a plastic, for example, the second light-guiding structure 172 may be arranged on the first light-guiding structure 171 once the first light-guiding structure 171 has been cured. The third light-guiding structure 173 may be arranged on the second light-guiding structure 172 as soon as the second light-guiding structure 172 is cured.

However, the wavelength-converting materials 161, 162, 163 need not necessarily be arranged on the light-emitting sections 31, 32, 33. The wavelength-converting materials 161, 162, 163 may also be arranged in regions in which the light-guiding structures 171, 172, 173 meet the optical element 153. In this example, the electromagnetic radiation extracted from the cavity 151 is converted by the wavelength-converting materials 161, 162, 163 when emerging from the cavity 151.

FIG. 11 shows a schematic plan view of the third example of the optoelectronic component 3, the optical element 153 not be represented. It may be seen that the light-guiding structures 171, 172, 173 are arranged concentrically around the optoelectronic semiconductor chip 11 in this view.

Figure 12:
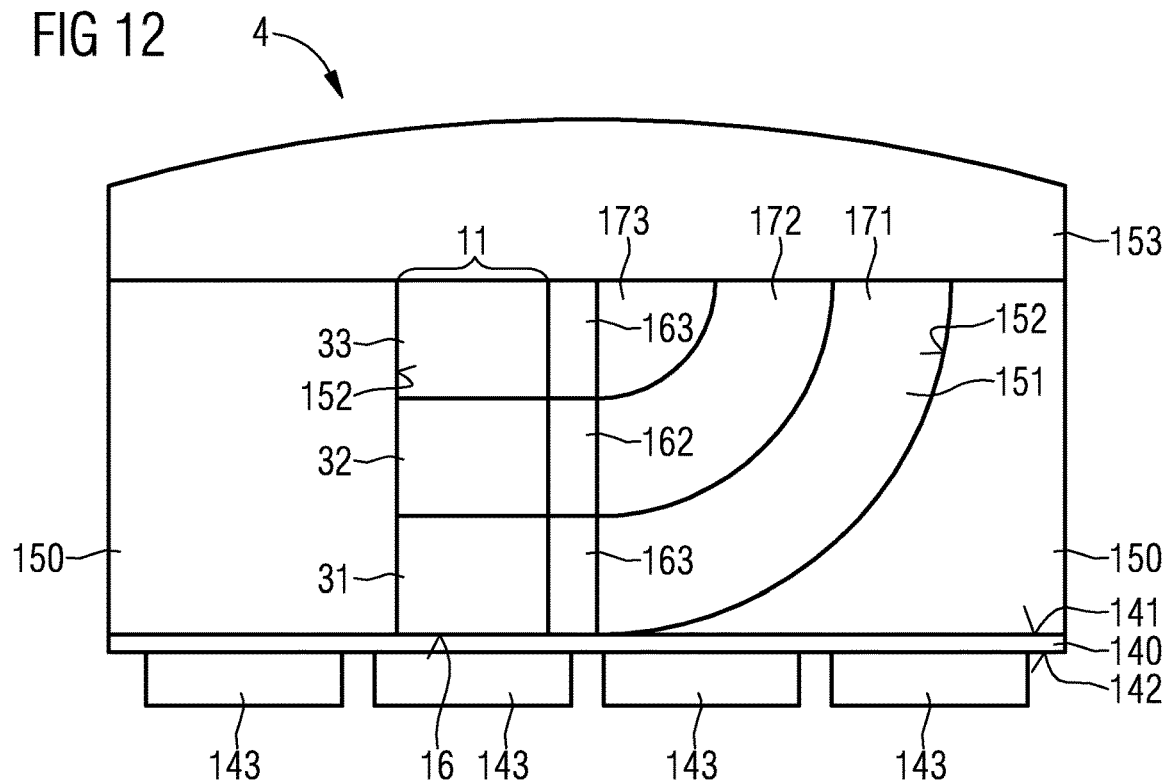
FIG. 12 schematically shows a lateral sectional view of a fourth example of an optoelectronic component.
Figure 13:
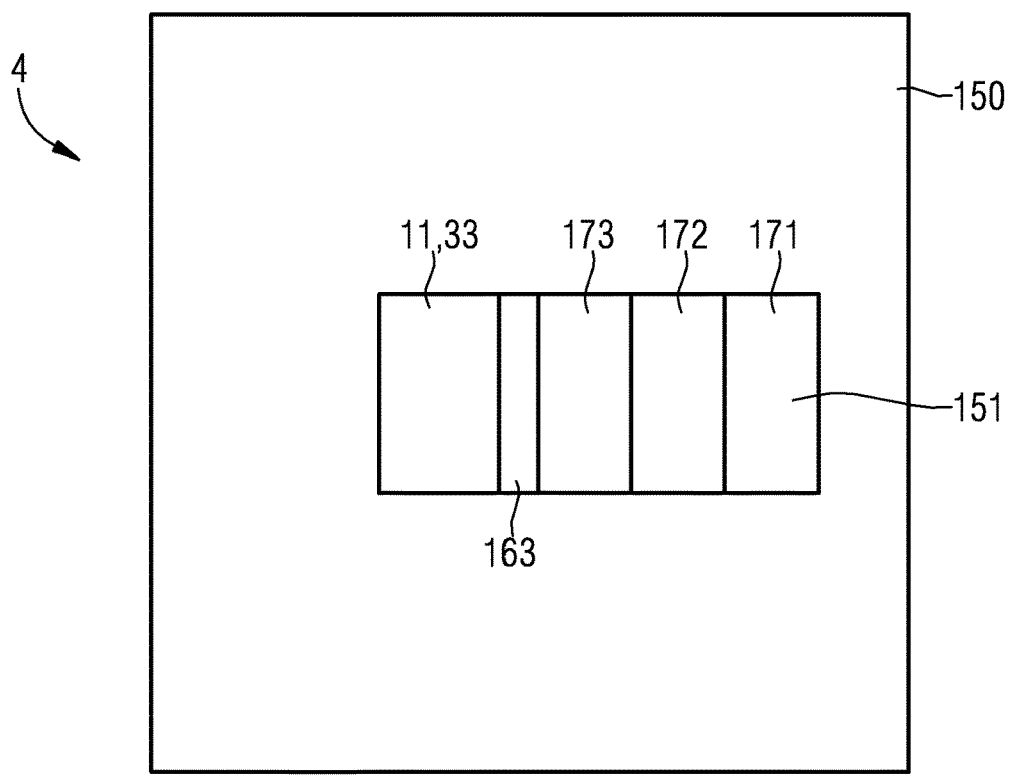
FIG. 13 schematically shows a plan view of the fourth example of the optoelectronic component.

FIG. 12 shows a schematic lateral sectional view of an optoelectronic component 4 according to a fourth example. FIG. 13 shows a schematic plan view of the fourth example of the optoelectronic component 4, the representation of the optical element having been omitted. The fourth example of the optoelectronic component 4 has great similarities with the third example of the optoelectronic component 3. Only the differences will be explained in the description below.

In contrast to the third example of the optoelectronic component 3, the light-guiding structures 171, 172, 173 are not arranged concentrically around the optoelectronic semiconductor chip 11, but extend only in one direction parallel to the carrier 140 and in a curved fashion to the optical element 153. For this reason, the cavity 151 is configured asymmetrically. In FIG. 12, it may be seen that one wall 152 of the cavity 151 is formed running perpendicularly to the mounting surface 140, while an opposite wall 152 of the cavity 151 is configured to be curved. In the plan view of FIG. 13, the cavity 151 therefore has a rectangular cross section.

Since the light-guiding structures 171, 172, 173 are not arranged concentrically around the optoelectronic semiconductor chip 11, the optoelectronic component 4 has a pixelated light-emitting surface. End surfaces of the light-guiding structures 171, 172, 173 that are in contact with the optical element 153, thus form pixels of the light-emitting surface.

Figure 14:
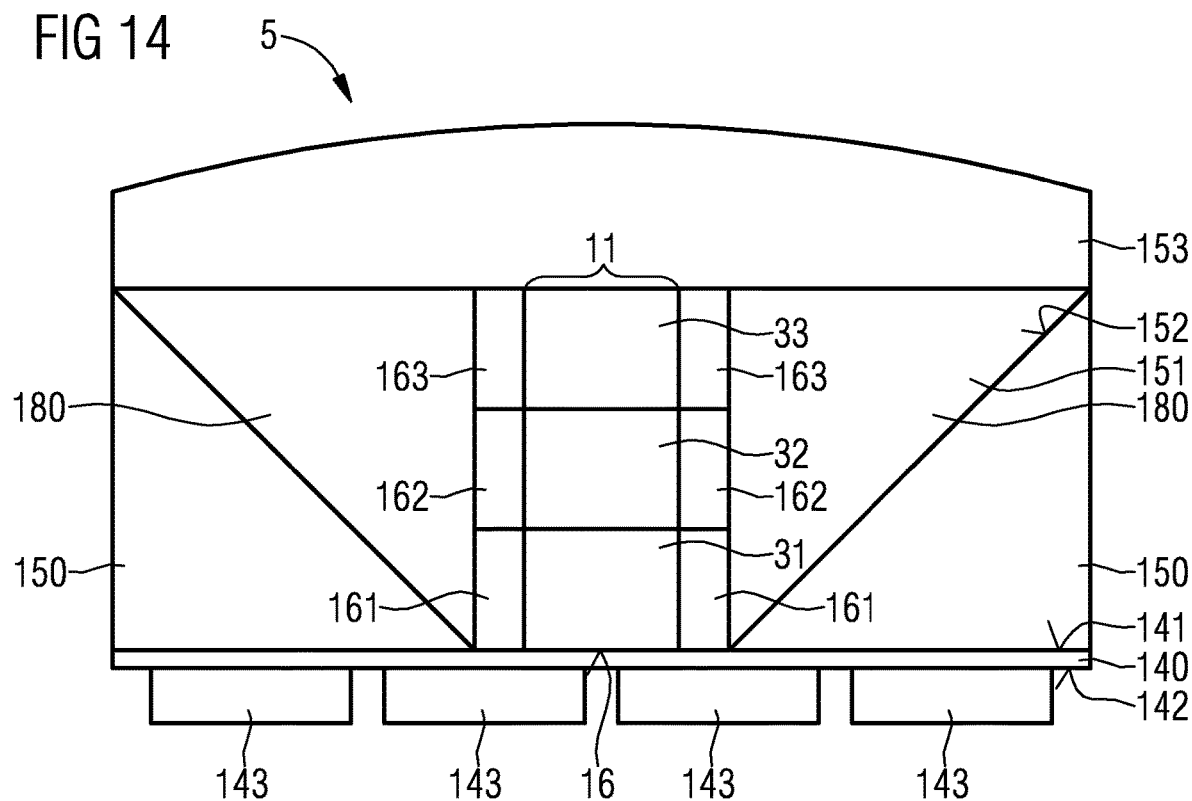
FIG. 14 schematically shows a lateral sectional view of a fifth example of an optoelectronic component.

FIG. 14 shows a schematic lateral sectional view of an optoelectronic component 5 according to a fifth example. The fifth example of the optoelectronic component 5 has great similarities with the first example of the optoelectronic component 1. Only the differences will be explained in the description below.

In contrast to the first example of the optoelectronic component 1, in the fifth example of the optoelectronic component 5 the wavelength-converting materials 161, 162, 163 do not extend as far as the wall 152 of the cavity 151 so that the wall 152 is free of the wavelength-converting materials 161, 162, 163. In the example represented, only the first wavelength-converting material 161 extends in the region of the mounting surface 141 as far as the molding material 150, the first wavelength-converting material 161 likewise not covering the wall 152. In this way, the cavity 151 is not fully filled with the wavelength-converting materials 161, 162, 163.

To arrange the wavelength-converting materials 161, 162, 163 as is shown in FIG. 14, the optoelectronic semiconductor chip 11 may initially be arranged in a cavity of an auxiliary molded body. The cavity of the auxiliary molded body may be filled in stages with the wavelength-converting materials 161, 162, 163. The auxiliary molded body may subsequently be removed. In this way, it is possible to obtain an optoelectronic semiconductor chip 11 whose light-emitting sections 31, 32, 33 are respectively enclosed annularly by the wavelength-converting materials 161, 162, 163. The optoelectronic semiconductor chip 11 enclosed by the wavelength-converting materials 161, 162, 163 may then be used to produce the optoelectronic component 5.

Since the cavity 151 is not fully filled with the wavelength-converting materials 161, 162, 163, the cavity 151 may additionally be filled with an encapsulation material 180. The encapsulation material 180 may comprise a plastic, for example, silicone. It is possible for the encapsulation material 180 to comprise embedded particles. The embedded particles are, for example, configured to scatter the electromagnetic radiation emitted by the light-emitting sections 31, 32, 33. This may improve an extraction efficiency of the optoelectronic component 5 and bring about homogenization of the emerging electromagnetic radiation. The particles may, for example, comprise silicon dioxide or titanium dioxide. The encapsulation material 180 may, however, also be omitted. As an alternative or in addition to the encapsulation material 180, the wall 152 of the cavity 151 may, for example, comprise a reflective coating.

Figure 15:
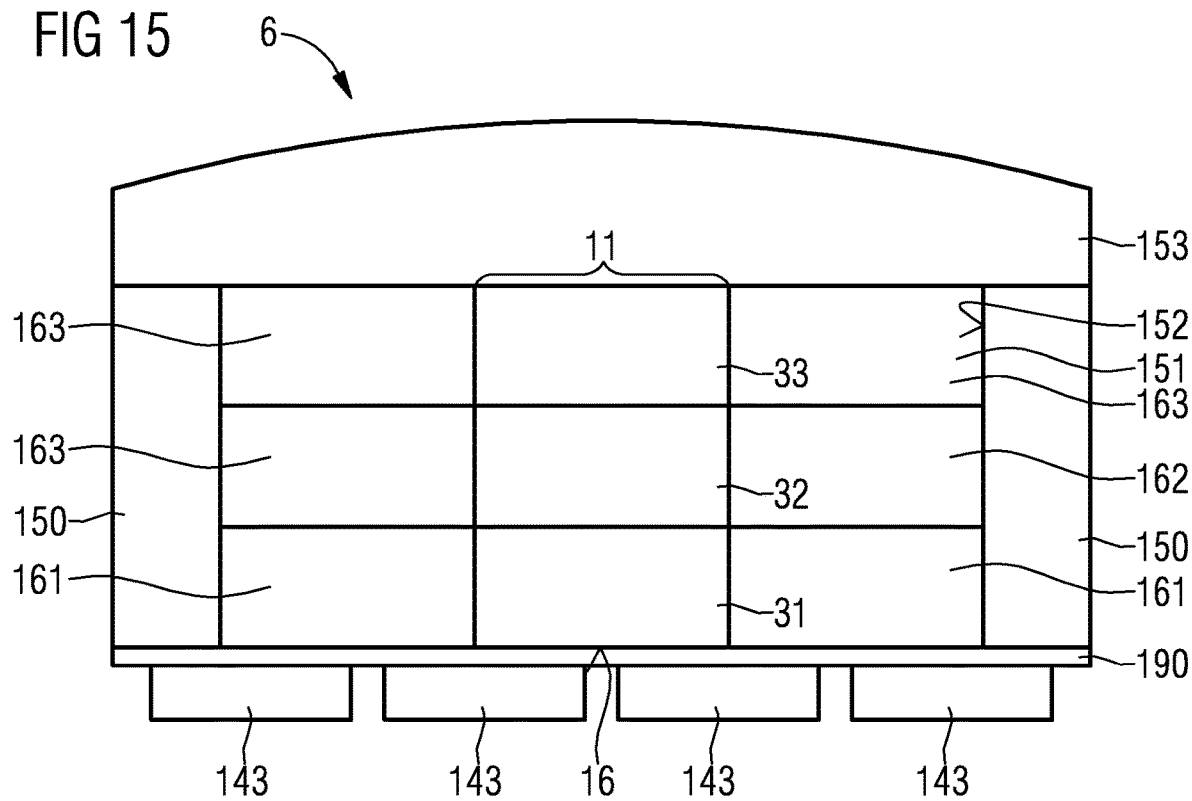
FIG. 15 schematically shows a lateral sectional view of a sixth example of an optoelectronic component.

FIG. 15 shows a schematic lateral sectional view of an optoelectronic component 6 according to a sixth example. The sixth example of the optoelectronic component 6 has great similarities with the first example of the optoelectronic component 1. Only the differences will be explained in the description below.

In the sixth example of the optoelectronic component 6, the optoelectronic semiconductor chip 11 is not arranged on a carrier. Initially, the wavelength-converting materials 161, 162, 163 are arranged on the optoelectronic semiconductor chip 11 by an auxiliary molded body. Subsequently, the molding material 150 is arranged around the wavelength-converting materials 161, 162, 163 by a molding method, the end side 16 and the side of the optoelectronic semiconductor chip 11 opposite to the end side 16, and surfaces of the wavelength-converting materials 161, 162, 163 that are formed parallel to the end side 16 remaining free of the molding material 150. An insulation 190 is then arranged on the lower side so that the end side 16 and the surface that lies in a plane with the end side 16, of the first wavelength-converting material 161 are covered by the insulation 190. The insulation 190 comprises contact pads 143 arranged on the side facing away from the optoelectronic semiconductor chip 11. The optical element 153 is arranged on the upper side.

In contrast to the first, the second and the fifth examples of the optoelectronic component 1, 2, 5, the cavity 151 is not conically open since the wall 152 of the cavity 151 is formed perpendicularly to the insulation 190. The sixth example of the optoelectronic component 6 may also be referred to as a chip-scale package.

All the optoelectronic components 1, 2, 3, 4, 5, 6 represented in FIGS. 8 to 15 may comprise optoelectronic semiconductor chips 11, 12, 13, 14, 15 according to one of the examples shown in FIGS. 1 to 7.

FIG. 16 shows a display device 7 having a multiplicity of optoelectronic components 1 in a schematic plan view. The display device 7 may, however, also comprise optoelectronic components 2, 3, 4, 5, 6 according to the second, third, fourth, fifth and sixth examples. In this example, a total of nine optoelectronic components 1 are shown in FIG. 16 that are arranged in a 3×3 matrix arrangement. This is merely exemplary. The display device 7 may have any number of optoelectronic components 1. The number of rows and columns of the matrix arrangement may also differ from the representation of FIG. 16. For the sake of simplicity, only the molding material 150, the cavities 151 formed therein, the optoelectronic semiconductor chips 11, arranged in the cavities 151, of the optoelectronic components 1 and the upper wavelength-converting materials 163 are represented in FIG. 16, it also being possible for optoelectronic semiconductor chips 12, 13, 14, 15 of the second, third, fourth and fifth examples to be arranged in the cavities 151. All the optoelectronic components 1 may, for example, be arranged on a further carrier.

The display device 7 may, for example, be a color display screen. In this example, each optoelectronic component 1 may be configured to generate light in three different colors, for example, red, green and blue. In this example, the color display screen is an RGB display screen.

Our components and devices have been illustrated and described in detail with the aid of preferred examples. This disclosure is not, however, restricted to the examples disclosed. Rather, other variants may be derived therefrom by those skilled in the art, without departing from the protective scope of the appended claims.

This application claims priority of DE 10 2017 129 226.8, the subject matter of which is incorporated herein by reference.

The invention claimed is:

1. An optoelectronic component, having an optoelectronic semiconductor chip, comprising a substrate and a carrier,
wherein at least two light-emitting sections are arranged laterally next to one another over an upper side of the substrate,
the light-emitting sections are separately controllable,
the optoelectronic semiconductor chip is arranged with an end side, formed perpendicularly to the upper side of the substrate, over a mounting surface of the carrier,
a molding material is arranged over the mounting surface of the carrier,
the molding material forms a cavity, and
the optoelectronic semiconductor chip is arranged in the cavity.

2. The optoelectronic component as claimed in claim 1, wherein the light-emitting sections generate electromagnetic radiation from different spectral ranges.

3. The optoelectronic component as claimed in claim 1, wherein the light-emitting sections are formed by a layer sequence,
an active region is formed inside the layer sequence,
trenches are formed between the light-emitting sections, and
the trenches fully divide the active region so that the light-emitting sections are separated from one another.

4. The optoelectronic component as claimed in claim 3, wherein layers located on one side of the active region of all the light-emitting sections are electrically contacted by a common electrical conductive track, and
the layers located on an opposite side of the active region of different light-emitting sections are electrically contacted by separate electrical conductive tracks.

5. The optoelectronic component as claimed in claim 4, wherein the electrical conductive tracks of different electrical poles are arranged on opposite sides of the active region,
the electrical conductive tracks respectively contacting a light-emitting section are embedded in insulation sections, and
the insulation sections are configured to electrically insulate the separate electrical conductive tracks extending along a plurality of light-emitting sections from one another such that, respectively, only one light-emitting section is electrically contacted by an electrical conductive track.

6. The optoelectronic component as claimed in claim 4, wherein the electrical conductive tracks are accessible on an end side formed perpendicularly to an upper side of the optoelectronic semiconductor chip.

7. The optoelectronic component as claimed in claim 1, wherein the light-emitting sections are formed by a layer sequence,
an active region is formed inside the layer sequence,
at least one outermost layer facing away from the active region of the layer sequence is a current distribution layer,
the current distribution layer comprises gaps, and
the gaps are formed between the light-emitting sections so that the light-emitting sections are separated from one another.

8. The optoelectronic component as claimed in claim 1, wherein the light-emitting sections are fully separated from one another,
the light-emitting sections are respectively formed by a layer sequence,
active regions are respectively formed within the layer sequences, and
the layer sequences of different light-emitting sections comprise different material systems.

9. The optoelectronic component as claimed in claim 1, wherein an electrically insulating material is arranged between the light-emitting sections.

10. The optoelectronic component as claimed in claim 1, wherein a wavelength-converting material is arranged on at least one of the at least two light-emitting sections and covers the at least one light-emitting section of the at least two light-emitting sections at least in sections, and
the wavelength-converting material does not cover any other light-emitting section.

11. The optoelectronic component as claimed in claim 10, wherein the wavelength-converting material fully covers the light-emitting section.

12. The optoelectronic component as claimed in claim 10, wherein the wavelength-converting material annularly encloses the substrate.

13. The optoelectronic component as claimed in claim 10, further comprising a further wavelength-converting material,
- wherein the further wavelength-converting material at least in sections covers a light-emitting section not covered by the wavelength-converting material, and
- the further wavelength-converting material does not cover any other light-emitting section.

14. The optoelectronic component as claimed in claim 10, wherein the wavelength-converting material extends from the optoelectronic semiconductor chip as far as a molding material.

15. The optoelectronic component as claimed in claim 10, wherein an encapsulation material is arranged in the cavity, the optoelectronic semiconductor chip, and a further wavelength-converting material is embedded in the encapsulation material.

16. The optoelectronic component as claimed in claim 15, wherein the encapsulation material comprises embedded particles.

17. The optoelectronic component as claimed in claim 10,
- wherein at least one light-guiding structure is arranged in the cavity,
- the light-guiding structure extends from the region not covered by the wavelength-converting material of the light-emitting section as far as the molding material,
- the light-guiding structure is formed running parallel to the end side of the optoelectronic semiconductor chip,
- the light-guiding structure annularly encloses the substrate, and
- the wavelength-converting material is arranged over the light-guiding structure in relation to the end side.

18. The optoelectronic component as claimed in claim 17, further comprising a further light-guiding structure, wherein the light-guiding structure and the further light-guiding structure extend starting from different light-emitting sections into the cavity.

19. A display device having an arrangement consisting of a multiplicity of optoelectronic components, wherein the optoelectronic components are configured as claimed in claim 1.

* * * * *